United States Patent
Vazny et al.

(10) Patent No.: US 10,541,716 B1
(45) Date of Patent: Jan. 21, 2020

(54) RADIO FREQUENCY FRONT-END CIRCUITRY AMPLIFIER GAIN CALIBRATION SYSTEMS AND METHODS

(71) Applicant: Apple Inc., Cupertino, CA (US)

(72) Inventors: Rastislav Vazny, Sunnyvale, CA (US);
Joonhoi Hur, Sunnyvale, CA (US);
Ronald W. Dimpflmaier, Los Gatos, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/146,064

(22) Filed: Sep. 28, 2018

(51) Int. Cl.
*H04B 1/40* (2015.01)
*H04B 1/405* (2015.01)
*H04B 1/18* (2006.01)
*H04B 17/16* (2015.01)
*H03F 3/195* (2006.01)

(52) U.S. Cl.
CPC ............. *H04B 1/405* (2013.01); *H03F 3/195* (2013.01); *H04B 1/18* (2013.01); *H04B 17/16* (2015.01); *H03F 2200/294* (2013.01); *H03F 2200/451* (2013.01)

(58) Field of Classification Search
CPC ... H04B 1/40; H04B 1/16; H04B 1/18; H04B 2001/0408; H04B 17/14; H04B 1/005; H04B 1/006; H04B 1/406; H04B 1/48; H04B 1/44; H04B 7/0802; H03F 2200/451; H03F 2200/294; H03F 3/189
See application file for complete search history.

(56) References Cited

U.S. PATENT DOCUMENTS

| | | | |
|---|---|---|---|
| 6,161,024 A * | 12/2000 | Komara | H04W 88/08 455/101 |
| 8,154,354 B2 | 4/2012 | Ricketts et al. | |
| 8,417,286 B2 * | 4/2013 | Gorbachov | H04B 1/0064 455/552.1 |
| 9,118,394 B2 * | 8/2015 | Black | H04B 1/406 |
| 9,270,302 B2 * | 2/2016 | Khlat | H04B 1/0064 |
| 10,390,343 B2 * | 8/2019 | Narathong | H04L 1/02 |
| 2016/0380754 A1 | 12/2016 | Chen et al. | |
| 2017/0346468 A1 | 11/2017 | Okazaki et al. | |

* cited by examiner

*Primary Examiner* — Nhan T Le
(74) *Attorney, Agent, or Firm* — Fletcher Yoder PC

(57) ABSTRACT

Systems and methods for improving operational efficiency of a radio frequency system, which includes an antenna amplifier unit that amplifies a data stream while the data stream is being wirelessly communicated and another antenna amplifier unit that amplifies another data stream while the other data stream is being wirelessly communicated. The radio frequency system includes a transceiver amplifier unit coupled to the antenna amplifier unit via an electrical connector, in which the transceiver amplifier unit amplifies the data stream while the data stream is being wirelessly communicated, another transceiver amplifier unit coupled to the other antenna amplifier unit via another electrical connector, in which the other transceiver amplifier unit amplifies the other data stream while the other data stream is being wirelessly communicated, and an electrical connector switching device coupled between antenna-sides of the electrical connector and the other electrical connector.

20 Claims, 16 Drawing Sheets

RADIO FREQUENCY FRONT-END CIRCUITRY AMPLIFIER GAIN CALIBRATION SYSTEMS AND METHODS

BACKGROUND

The present disclosure generally relates to radio frequency systems and, more particularly, to calibration of amplifier gain that may be implemented in front-end circuitry of a radio frequency system.

This section is intended to introduce the reader to various aspects of art that may be related to various aspects of the present techniques, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Electronic devices often include a radio frequency system to facilitate wireless data communication with another electronic device and/or a communication network, such as a Wi-Fi network and/or a cellular network. Generally, a radio frequency system may include an antenna and front-end circuitry, for example, implemented at least in part in a transceiver integrated circuit (IC). To wirelessly transmit data, the front-end circuitry may output an analog representation of the data as an analog electrical signal and the antenna may modulate electromagnetic (e.g., radio) waves based at least in part on the analog electrical signal. Additionally or alternatively, the antenna may output an analog representation of received (e.g., incident) electromagnetic waves as an analog electrical signal and the front-end circuitry may process the analog electrical signal, for example, to convert the analog electrical signal into a digital electrical signal to facilitate subsequent processing.

However, at least in some instances, an electronic device may be implemented such that its transceiver integrated circuit is located some distance away from an antenna, for example, when its radio frequency system includes multiple antennas implemented at disparate locations in the electronic device. As such, one or more electrical connectors, such as a wire, a cable, a conductive trace, and/or the like, may be coupled between the transceiver integrated circuit and the antenna. Generally, when an electrical signal is passed (e.g., communicated or transmitted) therethrough, an electrical connector may introduce some amount of loss on the electrical signal, for example, due to its inherent impedance. Moreover, similar to an antenna, incident electromagnetic waves may induce electrical current in an electrical connector, which, at least in some instances, may introduce noise in an electrical signal concurrently being communicated through the electrical connector, for example, by distorting the electrical signal. In other words, when not properly accounted for, implementing one or more electrical connectors in a radio frequency system may affect (e.g., reduce) communication reliability provided by the radio frequency system.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

The present disclosure generally relates to radio frequency systems, which may be implemented in electronic devices to facilitate wireless data communication. More specifically, to facilitate improving communication reliability and/or operational efficiency, the present disclosure provides techniques for implementing front-end circuitry in a radio frequency system and/or calibrating (e.g., optimizing) gain to be applied by one or more amplifier units implemented in the front-end circuitry during wireless communication. In some embodiments, gain (e.g., transmit gain and/or receipt gain) to be applied by an amplifier unit during wireless communication may be calibrated based at least in part on connector loss of an electrical connector coupled to the amplifier unit. For example, the gain to be applied by a first transceiver amplifier unit and/or a first antenna amplifier unit may be calibrated based at least in part on a first connector loss of a first electrical connector coupled between the first transceiver amplifier unit and the first antenna amplifier unit. Additionally or alternatively, the gain to be applied by a second transceiver amplifier unit and/or a second antenna amplifier unit may be calibrated based at least in part on a second connector loss of a second electrical connector coupled between the second transceiver amplifier unit and the second antenna amplifier unit.

To facilitate determining connector loss, in some embodiments, one or more switching may be coupled to electrical connectors running between the transceiver amplifier units and the antenna amplifiers implemented in the front-end circuitry. For example, a first electrical connector switching device may be coupled between a first antenna-side of the first electrical connector and a second antenna-side of the second electrical connector. In some embodiments, the radio frequency system may connect the antenna-sides of the during the calibration process to facilitate determining a combined connector loss of the first electrical connector and the second electrical connector. For example, the radio frequency system may supply a first test signal (e.g., sine wave) to the first transceiver amplifier unit while a transmit amplifier is connected in the first transceiver amplifier, the antenna-sides of the electrical connectors are electrically connected, and a receipt amplifier is connected in the second transceiver amplifier and, thus, determine the combined connector loss based at least in part on the output power of the first test signal, the return power of the first test signal, the transmit gain applied by the transmit amplifier, and the receipt gain applied by the receipt amplifier.

In addition to the first electrical connector switching device, in some embodiments, a second electrical connector switching device may be coupled between a first transceiver-side of the first electrical connector and a second transceiver-side of the electrical connector. In some embodiments, the radio frequency system may connect the transceiver-sides of the electrical connectors during the calibration process to facilitate determining an initial combined gain of the the transmit gain applied by the transmit amplifier and the receipt gain applied by the receipt amplifier. For example, the radio frequency system may supply a second test signal (e.g., sine wave) to the first transceiver amplifier unit while the transmit amplifier is connected in the first transceiver amplifier, the transceiver-sides of the electrical connectors are electrically connected, and the receipt amplifier is connected in the second transceiver amplifier and, thus, determine the initial combined gain based at least in part on the output power of the second test signal and the return power of the second test signal.

Furthermore, in some embodiments, an analog electrical signal generator may be selectively connected to the antenna amplifier units during the calibration process. For example, a first signal generator switching device may be coupled between the analog electrical signal generator and the first antenna amplifier unit. Additionally, a second signal generator switching device may be coupled between the analog electrical signal generator and the second antenna amplifier unit.

In some embodiments, the radio frequency system may selectively connect the analog electrical signal generator to the antenna amplifier units during the calibration process to facilitate determining individual connector losses. For example, the radio frequency system may supply a third test signal (e.g., sine wave) to the first antenna amplifier unit while a first receipt amplifier is connected in the first antenna amplifier, the electrical connectors are electrically disconnected from one another, and a second receipt amplifier is connected in the first transceiver amplifier. Separately, the radio frequency system may supply a fourth test signal (e.g., sine wave) to the second antenna amplifier unit while a third receipt amplifier is connected in the second antenna amplifier, the electrical connectors are electrically disconnected from one another, and a fourth receipt amplifier is connected in the second transceiver amplifier.

As such, the radio frequency system may determine a connector loss difference between the first electrical connector and the second electrical connector based at least in part on output power of the third test signal, return power of the third test signal, output power of the fourth test signal, and return power of the fourth test signal. Additionally, the radio frequency system may determine a first connector loss of the first electrical connector and/or a second connector loss of the second electrical connector based at least in part on the connector loss difference and the combined connector loss. For example, the radio frequency system may determine the first connector loss of the first electrical connector by adding the connector loss difference to the combined connector loss and dividing by two.

In some embodiments, the radio frequency system may determine the second connector loss of the second electrical connector in an analogous manner. For example, the radio frequency system may determine the second connector loss of the second electrical connector by subtracting the connector loss difference from the combined connector loss and dividing by two. Additionally or alternatively, the radio frequency system may determine and/or verify the second connector loss of the second electrical connector based at least in part on the first connector loss of the first electrical connector. For example, the radio frequency system may determine and/or verify the second connector loss of the second electrical connector by subtracting the first connector loss of the first electrical connector from the combined connector loss.

As described above, gain (e.g., transmit gain and/or receipt gain) to be applied by an amplifier unit implemented front-end circuitry of a radio frequency system during wireless communication may be calibrated (e.g., optimized) based at least in part on connector loss expect to result on an electrical connector coupled to the amplifier unit. In some embodiments, gain to be applied by an amplifier unit may be increased to offset (e.g., compensate for) connector loss. For example, a gain to be applied by the first transceiver amplifier unit and/or a gain to be applied by the first antenna amplifier unit during wireless communication (e.g., after the calibration process) may be increased from a first initial value (e.g., used to calibration process) to a first adjusted value (e.g., initial value+first conductor loss of first electrical connector). Additionally or alternatively, a gain to be applied by the second transceiver amplifier unit and/or a gain to be applied by the second antenna amplifier unit may be increased from a second initial value to a second adjusted value (e.g., initial value+second conductor loss of second electrical connector).

Moreover, in some embodiments, the gain to be applied by one or more transmit (e.g., power) amplifiers during wireless transmission may be calibrated to optimize tradeoffs between power consumption resulting from amplification, transmission distance resulting from the amplification, filtering effectiveness resulting from the amplification, and/or noise resulting from concurrent transmission of electromagnetic waves, for example, explicitly via a transmit objective function that weights such factors. Additionally or alternatively, the gain to be applied by one or more receipt (e.g., low noise) amplifiers may be calibrated to optimize tradeoffs between power consumption resulting from amplification and effects on resolution of an analog-to-digital converter resulting from the amplification, for example, explicitly via a receipt objective function that weights such factors. In this manner, the present disclosure provides techniques for implementing front-end circuitry in a radio frequency system and/or calibrating gain to be applied in the front-end circuitry during wireless communication to facilitate improving operational efficiency and/or communication reliability of the radio frequency system and, thus, an electronic device in which the radio frequency system is implemented.

BRIEF DESCRIPTION OF THE DRAWINGS

Various aspects of the present disclosure may be better understood upon reading the following detailed description and upon reference to the drawings in which.

DETAILED DESCRIPTION

Figure 1:
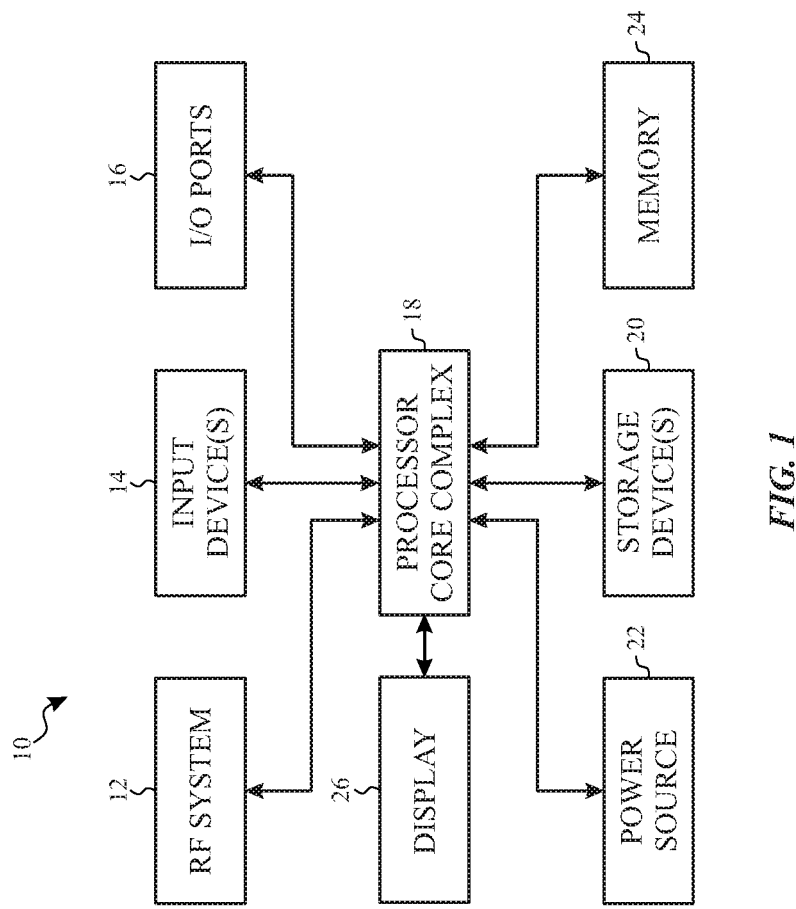
FIG. 1 is a block diagram of an electronic device including a radio frequency system, in accordance with an embodiment of the present disclosure.

One or more specific embodiments of the present disclosure will be described below. These described embodiments are only examples of the presently disclosed techniques. Additionally, in an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but may nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features.

The present disclosure generally relates to radio frequency systems, which may be implemented in electronic devices to facilitate wireless data communication. For example, a radio frequency system may facilitate wireless data communication between electronic devices. Additionally or alternatively, a radio frequency system may facilitate wireless data communication between an electronic device and a communication network, such as a Bluetooth network, a Wi-Fi network, and/or a cellular (e.g., LTE, 5G, or millimeter wave) network.

Generally, different types of communication networks may utilize different communication protocols and/or different communication frequencies. For example, a long-term evolution (LTE) communication network may utilize a lower communication frequency, such as an 850 MHz band, a 1900 MHz band, or a 2100 MHz band. On the other hand, a millimeter wave (mmWave) communication network may utilize a higher communication frequency, such as a 28 GHz band (e.g., 24.25-29.5 GHz), a 38 GHz band (e.g., 37-43.5 GHz), or a 60 GHz band (e.g., 54-71 GHz). Additionally or alternatively, a millimeter wave communication network may support signal polarization, for example, to enable a first data stream to be communicated using a horizontal polarization and a second (e.g., different) data stream to be concurrently communicated using vertical polarization.

To facilitate wireless communication, a radio frequency system generally includes one or more antennas and front-end circuitry, for example, implemented at least in part in a transceiver integrated circuit (IC). In some embodiments, a radio frequency system may be implemented with multiple antennas to enable the radio frequency system to communicate at multiple different frequencies or bands. Additionally or alternatively, a radio frequency system may be implemented with an array of antennas, for example, which may be supplied analog electrical signals phase shifted relative to one another to enable beam forming. Since generally increasing with communication frequency, at least in some instances, implementing beam forming techniques may facilitate overcoming propagation loss—particularly at higher communication frequencies or bands (e.g., supported by millimeter wave communication network).

Nevertheless, operation of radio frequency systems to wirelessly communicate data may be generally similar. For example, based at least in part on received (e.g., incident) electromagnetic waves corresponding with first data, an antenna implemented in a radio frequency system may output an analog representation of the first data to front-end circuitry of the radio frequency as a first analog electrical signal. Based at least in part on the first analog electrical signal, the front-end circuitry may generate a digital representation of the first data as a first digital electrical signal, thereby wirelessly receiving the first data.

Additionally or alternatively, to wirelessly transmit second data, a radio frequency system may supply a digital representation of the second data to its front-end circuitry as a second digital electrical signal. Based at least in part on the second digital electrical signal, the front-end circuitry may generate an analog representation of the second data as a second analog electrical signal. An antenna coupled to the front-end circuitry may then may modulate electromagnetic (e.g., radio) waves based at least in part on the second analog electrical signal, thereby wirelessly transmitting the second data.

As described above, front-end circuitry in a radio frequency system may be implemented at least in part in a transceiver integrated circuit (e.g., device or chip). For example, the transceiver integrated circuit may include an analog-to-digital converter (ADC) and/or a digital-to-analog converter (DAC). However, at least in some instances, the transceiver integrated circuit may be separated from an antenna by some distance, for example, when the radio frequency system is implemented with multiple antennas positioned at disparate locations in an electronic device.

Accordingly, to facilitate data communication, one or more electrical connectors (e.g., conductive traces, wires, and/or cables) may be coupled between the transceiver integrated circuit and an antenna. For example, to facilitate improving wireless (e.g., cellular) coverage provided, a first antenna integrated circuit, which includes a first one or more antennas, may be positioned at a first end of the electronic device while a second antenna integrated circuit, which includes a second one or more antennas, is positioned at a second (e.g., opposite) end of the electronic device. To facilitate communicating with both the first antenna integrated circuit and the second antenna integrated circuit, the transceiver integrated circuit may be positioned at a more central location in the electronic device, communicatively coupled to the first antenna integrated circuit via a first one or more electrical connectors, and communicatively coupled to the second antenna integrated circuit via a second one or more electrical connectors.

However, similar to an antenna, electromagnetic waves incident on an electrical connector may induce electrical current in the electrical connector. In other words, when an electrical signal is concurrently being communicated via an electrical connector, electromagnetic waves incident on the electrical connector may produce noise in the electrical signal, for example, due to the induced electrical current distorting the electrical signal. In fact, magnitude (e.g., power) and/or frequency of noise introduced in an electrical connector is generally dependent on magnitude and/or frequency of electromagnetic waves incident on the electrical connector. For example, electromagnetic waves with a frequency of 28 GHz may introduce 28 GHz noise. Additionally or alternatively, magnitude of introduced noise may increase as magnitude of the incident electromagnetic waves increases.

To reduce likelihood of noise affecting communication reliability provided by a radio frequency system, at least in some instances, one or more filters (e.g., band-pass filters) may be implemented in its front-end circuitry, for example, to attenuate frequencies outside a target communication frequency or band. Additionally, to reduce likelihood of noise affecting communication reliability, a radio frequency system may be implemented with electromagnetic shielding disposed around (e.g., about) the electrical connectors. However, electromagnetic shielding is generally finite. In fact, at least in some instances, increasing electromagnetic shielding may affect (e.g., increase) implementation associated cost, such as component count, manufacturing steps, and/or physical size (e.g., footprint).

Moreover, data communication (e.g., transmission) generally introduces some amount of loss. For example, when an electromagnetic wave is transmitted from a radio frequency system, the transmission medium (e.g., air) may introduce propagation loss that generally reduces magnitude (e.g., strength) of the electromagnetic wave with distance traveled squared. In fact, propagation loss generally increases as frequency of electromagnetic waves increases. Additionally or alternatively, when an analog electrical signal is transmitted through an electrical connector, the electrical connector may introduce connector loss that generally reduces magnitude (e.g., strength) of the analog electrical signal with distance traveled, for example, due to inherent impedance (e.g., resistance, capacitance, and/or inductance) of the electrical connector.

To facilitate overcoming such communication losses, front-end circuitry implemented in a radio frequency system may amplify an analog electrical signal, for example, via an amplifier (e.g., buffer) unit (e.g., assembly or device) that includes a selectively connectable transmit (e.g., power) amplifier and/or a selectively connectable receipt (e.g., low noise) amplifier. In some instances, to facilitate compensating for propagation loss, one or more amplifier units may be implemented an on antenna-side of an electrical connector, for example, in an antenna integrated circuit. Additionally or alternatively, a first one or more amplifier units may be implemented on a transceiver-side of an electrical connector and a second one or more amplifier units may be implemented on an antenna-side of the electrical connector, for example, in a transceiver integrated circuit and an antenna integrated circuit, respectively.

However, applying amplification (e.g., gain) to an analog electrical signal generally consumes electrical power. In fact, power consumption of an amplifier unit generally increases as the applied gain increases. In other words, the gain applied by one or more amplifier units implemented in a radio frequency system may affect power consumption and, thus, operational efficiency of the radio frequency system.

Moreover, at least in some instances, the gain applied by one or more amplifier units in a radio frequency system may affect communication reliability provided by the radio frequency system. For example, increasing gain applied to an analog electrical signal during transmission may increase output power of corresponding electromagnetic waves, which, at least in some instances, facilitates overcoming propagation losses. However, since magnitude of electromagnetic waves decrease with distance squared, electromagnetic waves currently being transmitted from a radio frequency system may be a large source of noise in electrical signals concurrently (e.g., simultaneously) being communicated on an electrical connector. In fact, since frequency of noise may be dependent on frequency of incident electromagnetic waves, effectiveness of filters at attenuating noise in analog electrical signal resulting from simultaneously transmitted electromagnetic waves may be limited, for example, due to the noise portion being at the same frequency as the data portion of the analog electrical signal.

Additionally or alternatively, increasing gain applied to an analog signal during reception may facilitate overcoming connector loss. However, the gain applied during reception may affect resolution and, thus, efficacy of an analog-to-digital converter, for example, implemented in a transceiver integrated circuit. In particular, analog-to-digital converters generally operate to convert an analog electrical signal into a digital electrical signal by mapping specific analog values (e.g., voltage and/or current magnitudes) within its dynamic range to corresponding digital values. Since magnitude is dependent thereon, at least in some instances, the gain applied to an analog electrical signal may affect communication reliability of a radio frequency system, for example, when the applied gain results in one or more analog values falling outside of the dynamic range of the analog-to-digital converter.

Accordingly, to facilitate improving communication reliability and/or operational efficiency, the present disclosure provides techniques for implementing front-end circuitry in a radio frequency system and/or calibrating (e.g., optimizing) gain to be applied by one or more amplifier units implemented in the front-end circuitry during wireless communication. In some embodiments, the calibration techniques may be performed offline, for example, during manufacture of the radio frequency system and/or assembly (e.g., integration) of an electronic device including the radio frequency system. Additionally or alternatively, the calibration techniques may be performed online, for example, after deployment of the electronic device and/or periodically after initial calibration.

To facilitate improving communication reliability and/or operational efficiency, the gain to be applied by an amplifier unit in the front-end circuitry during wireless communication may be calibrated based at least in part on connector loss resulting in an electrical connector coupled to the amplifier unit. As described above, a first one or more amplifier units may be implemented on a transceiver-side of an electrical connector and a second one or more amplifier units may be implemented on an antenna-side of the electrical connector, for example, to facilitate overcoming connector loss. As an illustrative example, a (e.g., first) transceiver amplifier unit may be implemented in a (e.g., first) transceiver integrated circuit and an antenna amplifier unit may be implemented in an antenna integrated circuit. Additionally, the transceiver amplifier unit and the antenna amplifier unit may be coupled via an (e.g., first) electrical connector. As such, the gain to be applied by the transceiver amplifier unit and/or the antenna amplifier unit during wireless communication may be calibrated based at least in part on the connector loss resulting from the electrical connector.

In some embodiments, multiple different data streams may be communicated between a transceiver integrated circuit and an antenna integrated circuit. For example, the transceiver integrated circuit and the antenna integrated circuit may be implemented to enable concurrently (e.g., simultaneously) communicating a first data stream and a second data stream. To facilitate concurrently communicating multiple different data stream, in some embodiments, the data streams (e.g., electromagnetic waves corresponding with different data streams) may be polarized relative to one another. For example, electromagnetic waves used to communicate the first data stream may be horizontally polarized while electromagnetic waves used to communicate the second data stream are vertically polarized.

Additionally, in some embodiments, different transceiver amplifier unit and antenna amplifier unit sets may be dedicated to different data streams. For example, the front-end circuitry may include a first transceiver amplifier unit and a first antenna amplifier unit, which are coupled via a first electrical connector and implemented to amplify electrical signals communicated via the first data stream. To enable simultaneous communication with the first data stream, the front-end circuitry may additionally include a second transceiver amplifier unit and a second antenna amplifier unit, which are coupled via a second electrical connector and implemented to amplify analog electrical communicated via the second data stream. As such, the gain to be applied by the second transceiver amplifier unit and/or the second antenna amplifier unit during wireless communication may be calibrated based at least in part on the connector loss resulting from the second electrical connector.

To facilitate determining connector loss, in some embodiments, one or more switching devices may be coupled to electrical connectors running between a transceiver integrated circuit and an antenna integrated circuit. For example, a first electrical connector switching device may be coupled between an antenna-side of the first electrical connector and an antenna-side of the second electrical connector. Additionally, in some embodiments, a second electrical connector switching device may be coupled on a transceiver-side of the first electrical connector and a transceiver-side of the second electrical connector.

Furthermore, in some embodiments, the connector loss of (e.g., resulting from) an electrical connector may be determined based at least in part on the combined connector loss of multiple electrical connectors. For example, to facilitate determining the combined connector loss of the first electrical connector and the second electrical connector, the radio frequency system may connect the first (e.g., antenna-side) electrical connector switching device, a transmit amplifier in the first transceiver amplifier unit, and a receipt amplifier in the second transceiver amplifier unit. While connected in this manner, the transceiver integrated circuit may output a first test (e.g., analog electrical) signal (e.g., sine wave) to the first transceiver amplifier unit and, after passing through at least a substantial portion of the electrical connectors, the second transceiver amplifier unit may return the first test signal to the transceiver integrated circuit.

As such, the radio frequency system (e.g., via a controller) may determine a combined connector loss of multiple electrical connectors based at least in part on the return power of a test signal passed through the multiple electrical connectors, the output power of the test signal, and the gain applied to the test signal. In some embodiments, the gain (e.g., decibels) to be applied by an amplifier unit may be pre-determined or otherwise known. In other words, in some embodiments, the gain applied on the first test signal by the transmit amplifier in the first transceiver amplifier unit, the gain applied on the first test signal by the receipt amplifier in the second transceiver amplifier unit, and/or a combined gain applied on the first test signal by the transmit amplifier and the receipt amplifier may be pre-determined or otherwise known.

Additionally or alternatively, the gain applied by one or more amplifier units implemented in front-end circuitry of a radio frequency system may be explicitly determined. For example, to facilitate determining the combined gain of the transmit amplifier and the receipt amplifier, the radio frequency system may connect the second (e.g., transceiver-side) electrical connector switching device, the transmit amplifier in the first transceiver amplifier unit, and the receipt amplifier in the second transceiver amplifier unit. While connected in this manner, the transceiver integrated circuit may output a second test (e.g., analog electrical) signal (e.g., sine wave) to the first transceiver amplifier unit and, without passing through a substantial portion of the electrical connectors, the second transceiver amplifier unit may return the second test signal to the transceiver integrated circuit.

As such, the radio frequency system (e.g., via a controller) may determine a combined gain applied by a transmit amplifier and a receipt amplifier based at least in part on the output power and the return power of a test signal not passed through a substantial portion of electrical connectors. For example, the radio frequency system may determine the combined gain of the transmit amplifier and the receipt amplifier by subtracting the return power from the output power of the second test signal.

As described above, a radio frequency system (e.g., via a controller) may determine a combined connector loss of multiple electrical connectors based at least in part on the return power of a test signal passed through the multiple electrical connectors, the output power of the test signal, and the gain applied to the test signal. For example, when determined in decibels (dBs), the radio frequency system may determine the combined connector loss of the first electrical connector and the second electrical connector by subtracting the return power, the gain of the receipt amplifier, and the gain of the transmit amplifier from the output power of the first test signal. In other words, the radio frequency system (e.g., via a controller) may determine the combined connector loss of the first electrical connector and the second electrical connector by subtracting the return power and the combined gain of the transmit amplifier and the receipt amplifier from the output power of the first test signal.

Additionally, as described above, a radio frequency system (e.g., via a controller) may determine the connector loss resulting from an individual electrical connector based at least in part on the combined connector loss of multiple electrical connectors. In some embodiments, the contribution of each electrical connector to the combined connector loss may be approximately (e.g., substantially) equal, for example, due to the electrical connectors being substantially the same length and/or size. Thus, in such embodiments, the combined connector loss may be equally divided between the electrical connectors. For example, the radio frequency system may determine a first connector loss of the first electrical connector and/or a second connector loss of the second electrical connector by dividing the combined connector loss in half.

Additionally or alternatively, a radio frequency system (e.g., via a controller) may more explicitly determine the connector loss of an individual electrical connector, for example, to facilitate accounting for instances in which different electrical connectors exhibit different connector losses. To facilitate more explicitly determining connector loss, in some embodiments, an analog electrical signal generator (e.g., local oscillator) may be selectively coupled to an antenna-side of the antenna amplifier units. For example, a first generator switching device may be coupled between the analog electrical signal generator and the first antenna amplifier unit and a second generator switching device may be coupled between the analog electrical signal generator and the second antenna amplifier unit.

To facilitate determining individual connector loss, the radio frequency system may connect the analog electrical signal generator to the first antenna amplifier unit, the receipt amplifier in the first antenna amplifier unit, and the receipt amplifier in the first transceiver amplifier unit. While connected in this manner, the analog electrical signal generator may output a third test (e.g., analog electrical) signal (e.g., sine wave) to the first antenna amplifier unit and, after passing through the first electrical connector, the first transceiver amplifier unit may return the third test signal to the transceiver integrated circuit. As such, based at least in part on the output power and the return (e.g., received) power of the third test signal, the radio frequency system (e.g., via a controller) may determine a first gain-loss value associated with the first electrical connector. For example, the radio frequency system may determine the first gain-loss value associated with the first electrical connector by subtracting the return power from the output power of the third test signal.

Additionally, to facilitate determining individual connector loss, the radio frequency system may connect the analog electrical signal generator to the second antenna amplifier unit, the receipt amplifier in the second antenna amplifier unit, and the receipt amplifier in the second transceiver amplifier unit. While connected in this manner, the analog electrical signal generator may output a fourth test (e.g., analog electrical) signal (e.g., sine wave) to the second antenna amplifier unit and, after passing through the second electrical connector, the second transceiver amplifier unit may return the fourth test signal to the transceiver integrated circuit. As such, based at least in part on the output power and the received power of the fourth test signal, the radio frequency system (e.g., via a controller) may determine a second gain-loss value associated with the second electrical connector. For example, the radio frequency system may determine the second gain-loss value associated with the second electrical connector by subtracting the return power from the output power of the fourth test signal.

In some embodiments, at least initially, receipt gain applied to different data streams may be substantially the same, for example, to facilitate calibration and/or when the different data streams use the same communication (e.g., transmission) frequency or band. In such embodiments, based at least in part on corresponding gain-loss values, the radio frequency system (e.g., via a controller) may determine the difference between conductor losses of multiple electrical connectors. For example, by subtracting the first gain-loss value from the second gain-loss value, the radio frequency system may determine a connector loss difference between the first electrical connector and the second electrical connector. In other words, the radio frequency system may determine the connector loss difference by subtracting the return power of the third test signal and a sum of the output power of the fourth test signal and the return power of the fourth test signal from the output power of the third test signal.

Additionally, the radio frequency system (e.g., via a controller) may determine an individual connector loss based at least in part on a combined connector loss and a connector loss difference that each includes the individual connector loss. For example, the radio frequency system may determine the first connector loss of the first electrical connector by adding the combined connector loss of the first electrical connector and the second electrical connector to the connector loss difference between the first electrical connector and the second electrical connector and dividing by two. In any analog manner, the radio frequency system may determine the second connector loss of the second electrical connector by subtracting the connector loss difference between the first electrical connector and the second electrical connector from the combined connector loss of the first electrical connector and the second electrical connector and dividing by two. Additionally or alternatively, the radio frequency system may determine and/or verify the second connector loss of the second electrical connector by subtracting the first connector loss of the first electrical connector from the combined connector loss.

As described above, gain (e.g., transmit gain and/or receipt gain) to be applied by an amplifier unit implemented front-end circuitry of a radio frequency system during wireless communication may be calibrated (e.g., optimized) based at least in part on connector loss expect to result on an electrical connector coupled to the amplifier unit. In some embodiments, gain to be applied by an amplifier unit may be increased to offset (e.g., compensate for) connector loss. For example, a first transmit gain to be applied by the transmit amplifier in the first transceiver amplifier unit and/or a first receipt gain to be applied by the receipt amplifier in the first antenna amplifier unit may be increased from a first initial value (e.g., used to calibration process) to a first adjusted value (e.g., initial value+conductor loss of first electrical connector). Additionally or alternatively, a second transmit gain to be applied by the transmit amplifier in the second transceiver amplifier unit and/or a second receipt gain to be applied by the receipt amplifier in the second antenna amplifier unit may be increased from a second initial value to a second adjusted value (e.g., initial value+conductor loss of second electrical connector).

Moreover, in some embodiments, the gain to be applied by one or more transmit (e.g., power) amplifiers during wireless communication may be calibrated to optimize tradeoffs between power consumption resulting from amplification, transmission distance resulting from the amplification, filtering effectiveness resulting from the amplification, and/or noise resulting from concurrent transmission of electromagnetic waves, for example, explicitly via a transmit objective function that weights such factors. Additionally or alternatively, the gain to be applied by one or more receipt (e.g., low noise) amplifiers may be calibrated to optimize tradeoffs between power consumption resulting from amplification and effects on resolution of an analog-to-digital converter resulting from the amplification, for example, explicitly via a receipt objective function that weights such factors. By implementing front-end circuitry in a radio frequency system to facilitate calibrating gain applied in the front-end circuitry during wireless communication in this manner, as will be described in more detail below, the techniques described in present disclosure may facilitate improving communication reliability and/or operational efficiency provided by the radio frequency system and, thus, an electronic device in which the radio frequency system is implemented.

To help illustrate, an example of an electronic device 10, which includes a radio frequency system 12, is shown in FIG. 1. As will be described in more detail below, the electronic device 10 may be any suitable electronic device, such as a computer, a mobile (e.g., portable) phone, a portable media device, a tablet device, a television, a handheld game platform, a personal data organizer, a virtual-reality headset, a mixed-reality headset, a vehicle dashboard, and/or the like. Thus, it should be noted that FIG. 1 is merely one example of a particular implementation and is intended to illustrate the types of components that may be present in an electronic device 10.

As depicted, in addition to the radio frequency system 12, the electronic device 10 includes one or more input devices 14, one or more input/output ports 16, a processor core complex 18, one or more main memory storage devices 20, a power source 22, local memory 24, and an electronic display 26. The various components described in FIG. 1 may include hardware elements (e.g., circuitry), software elements (e.g., a tangible, non-transitory computer-readable medium storing instructions), or a combination of both hardware and software elements. It should be noted that the various depicted components may be combined into fewer components or separated into additional components. For example, the local memory 24 and a main memory storage device 20 may be included in a single memory or storage component.

Additionally, as depicted, the processor core complex 18 is operably coupled with the local memory 24 and the main memory storage device 20. Thus, in some embodiments, the processor core complex 18 may execute instruction stored in local memory 24 and/or the main memory storage device 20 to perform operations, such as instructing the radio frequency system 12 to communicate with another electronic device and/or a communication network. As such, the processor core complex 18 may include one or more general purpose microprocessors, one or more application specific processors (ASICs), one or more field programmable logic arrays (FPGAs), or any combination thereof.

In addition to instructions, the local memory 24 and/or the main memory storage device 20 may store data to be processed by the processor core complex 18. Thus, in some embodiments, the local memory and/or the main memory storage device 20 may include one or more tangible, non-transitory, computer-readable mediums. For example, the local memory 24 may include random access memory (RAM) and the main memory storage device 20 may include read only memory (ROM), rewritable non-volatile memory such as flash memory, hard drives, optical discs, and/or the like.

As depicted, the processor core complex 18 is also operably coupled with the I/O ports 16. In some embodiments, the I/O ports 16 may enable the electronic device 10 to interface with other electronic devices. For example, a portable storage device may be connected to an I/O port 16, thereby enabling the processor core complex 18 to communicate data with the portable storage device.

Additionally, as depicted, the processor core complex 18 is operably coupled to the power source 22. In some embodiments, the power source 22 may provide electrical power to one or more components in the electronic device 10, such as the processor core complex 18 and/or the radio frequency system 12. Thus, the power source 22 may include any suitable energy source, such as a rechargeable lithium polymer (Li-poly) battery and/or an alternating current (AC) power converter.

Furthermore, as depicted, the processor core complex 18 is operably coupled with the input devices 14. In some embodiments, the input device 14 may facilitate user interaction with the electronic device 10, for example, by receiving user inputs. Thus, in some embodiments, the input devices 14 may include a button, a keyboard, a mouse, a trackpad, and/or the like. Additionally, in some embodiments, the input devices 14 may include touch sensing components implemented in the electronic display 26. In such embodiments, the touch sensing components may receive user inputs by detecting occurrence and/or position of an object contacting the surface of the electronic display 26.

In addition to enabling user inputs, the electronic display 26 may display images, such as a graphical user interface (GUI) for an operating system, an application interface, a still image, or video content. As depicted, the electronic display 26 is operably coupled to the processor core complex 18. As such, the electronic display 26 may display images based at least in part on image data received from the processor core complex 18.

As depicted, the processor core complex 18 is also operably coupled with the radio frequency system 12. As described above, the radio frequency system 12 may facilitate wirelessly communication with another electronic device and/or a communication network. For example, the radio frequency system 12 may enable the electronic device 10 to communicate with a personal area network (PAN), such as a Bluetooth network, a local area network (LAN), such as an 802.11x Wi-Fi network, and/or a wide area network (WAN), and such as an LTE or a millimeter wave (mmWave) cellular network. In other words, the radio frequency system 12 may enable wirelessly communicating data using various communication protocols and/or communication frequencies.

Even when using different communication protocols and/or different communication frequencies, operational principles of radio frequency systems 12 are generally similar. For example, the radio frequency system 12 may convert a digital electrical signal, which digitally represents data to be transmitted, into an analog electrical signal, thereby generating an analog representation of the data. Additionally, the radio frequency system 12 may amplify the analog electrical signal to a target output power, thereby generating an amplified analog electrical signal, for example, after converting the analog electrical signal from a processing (e.g., intermediate or baseband) frequency to a target communication (e.g., transmission and/or reception) frequency. Based at least in part on the amplified analog electrical signal, the radio frequency system 12 may modulate electromagnetic waves at a radio frequency, thereby wirelessly transmitting corresponding data via an electromagnetic radio frequency signal.

Additionally or alternatively, the radio frequency system 12 may generate an analog electrical signal modulated based at part on power of received (e.g., incident) electromagnetic waves, thereby indicating wirelessly received data via an analog electrical radio frequency signal. Since received electromagnetic waves often include electromagnetic interference, the radio frequency system 12 may filter and/or amplify the analog electrical radio frequency signals. Furthermore, to facilitate subsequent processing, the radio frequency system 12 may process the analog electrical signal, for example, to convert the analog electrical signal from the communication (e.g., transmission and/or reception) frequency to a processing (e.g., intermediate or baseband) frequency and/or to convert the analog electrical signal into a digital electrical signal. Due to similarities in operational principles, it should be appreciated that the techniques described herein may be applicable to any suitable radio frequency system 12 regardless of communication protocol or communication frequency.

Figure 2:
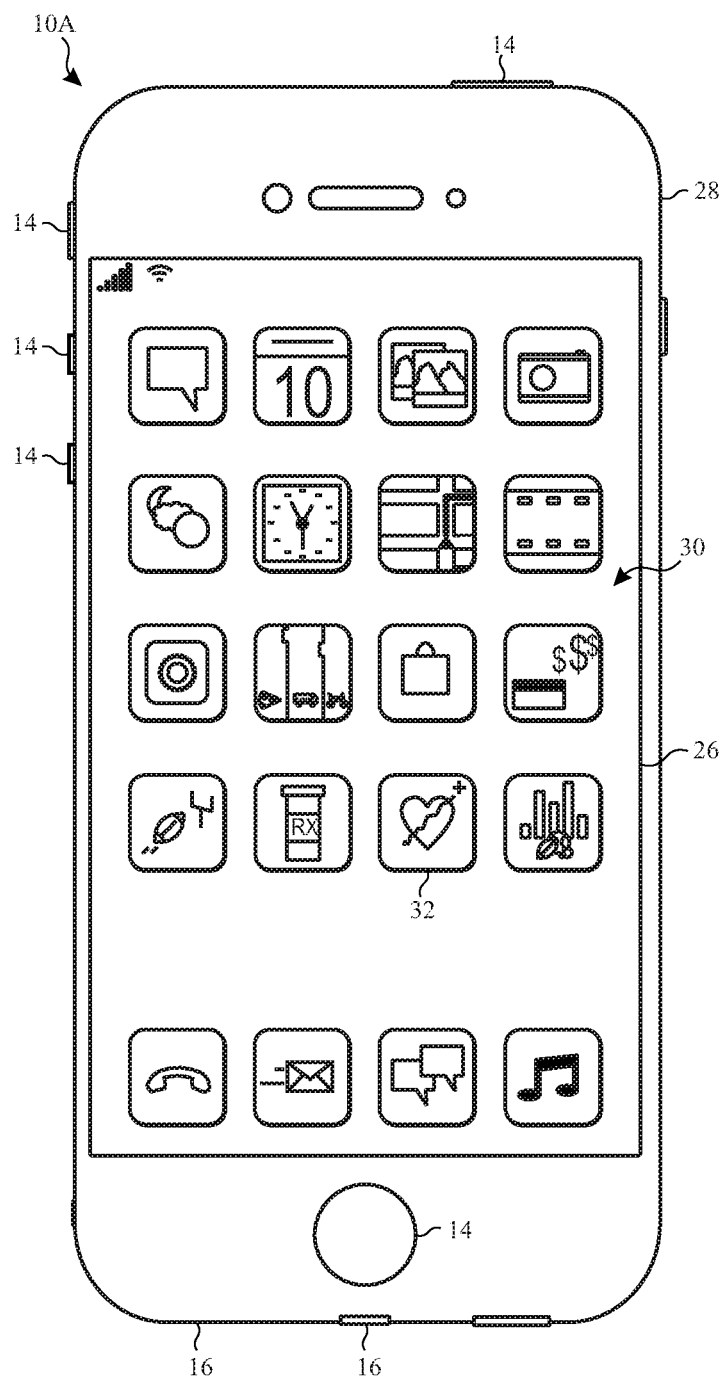
FIG. 2 is an example of the electronic device of FIG. 1, in accordance with an embodiment; of the present disclosure.

As described above, the electronic device 10 may be any suitable electronic device. To help illustrate, one example of a suitable electronic device 10, specifically a handheld electronic device 10A, is shown in FIG. 2. In some embodiments, the handheld electronic device 10A may be a portable phone, a media player, a personal data organizer, a handheld game platform, and/or the like. For example, the handheld electronic device 10A may be a smart phone, such as any iPhone® model available from Apple Inc.

As depicted, the handheld electronic device 10A includes an enclosure 28 (e.g., housing). In some embodiments, the enclosure 28 may protect interior components from physical damage and/or shield them from electromagnetic interference. As such, in some embodiments, at least a portion of a radio frequency system 12 may also be enclosed within the enclosure 28 and, thus, internal to the handheld electronic device 10A.

Additionally, as depicted, the enclosure 28 may surround the electronic display 26. In the depicted embodiment, the electronic display 26 is displaying a graphical user interface (GUI) 29 having an array of icons. By way of example, when an icon is selected either by an input device 14 or a touch sensing component of the electronic display 26, an application program may launch.

Furthermore, as depicted, input devices 14 open through the enclosure 28. As described above, the input devices 14 may enable a user to interact with the handheld electronic device 10A. For example, the input devices 14 may enable the user to activate or deactivate the handheld electronic device 10A, navigate a user interface to a home screen, navigate a user interface to a user-configurable application screen, activate a voice-recognition feature, provide volume control, and/or toggle between vibrate and ring modes. As depicted, the I/O ports 16 also open through the enclosure 28. In some embodiments, the I/O ports 16 may include, for example, an audio jack to connect to external devices.

Figure 3:
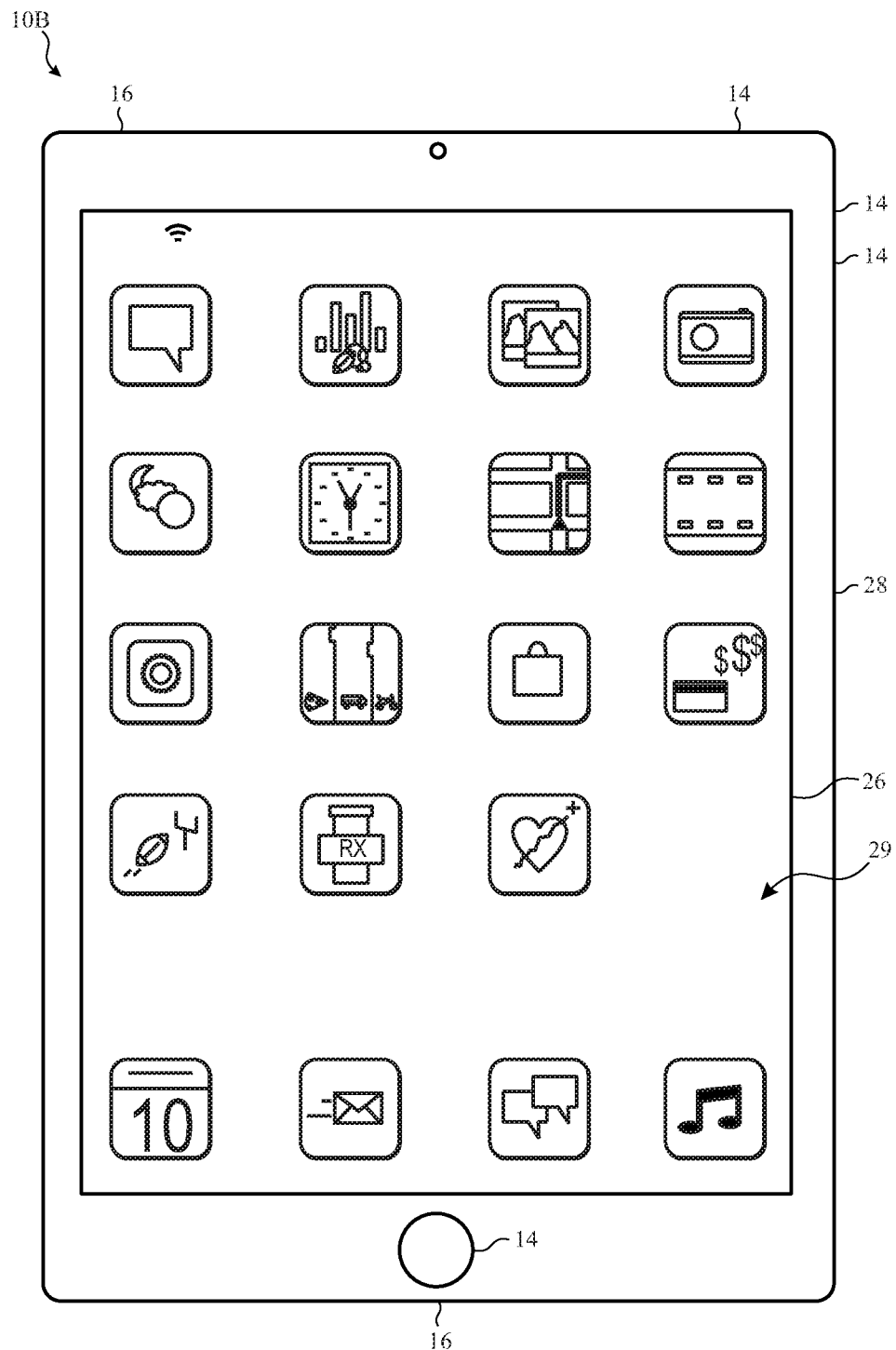
FIG. 3 is another example of the electronic device of FIG. 1, in accordance with an embodiment of the present disclosure.
Figure 4:
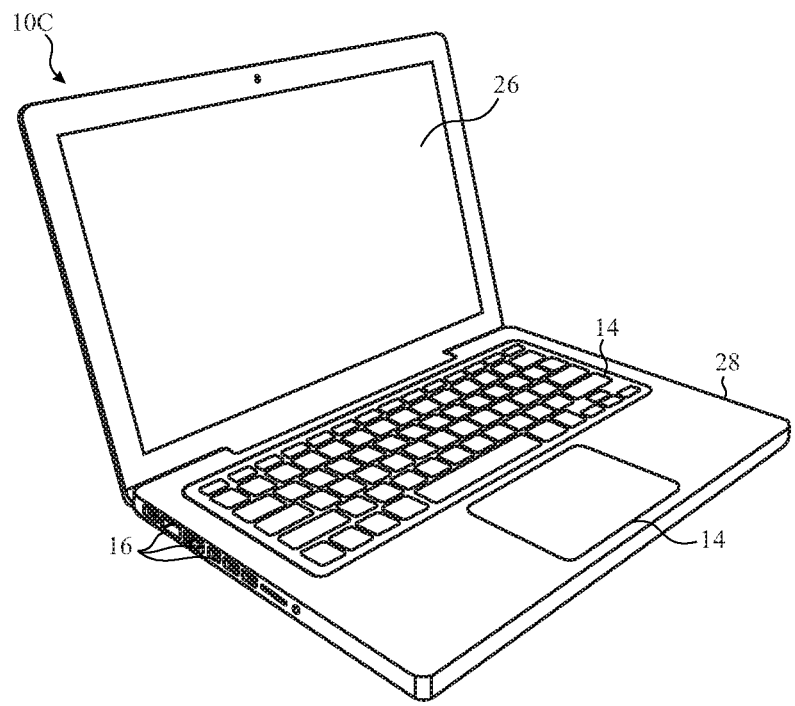
FIG. 4 is another example of the electronic device of FIG. 1, in accordance with an embodiment of the present disclosure.
Figure 5:
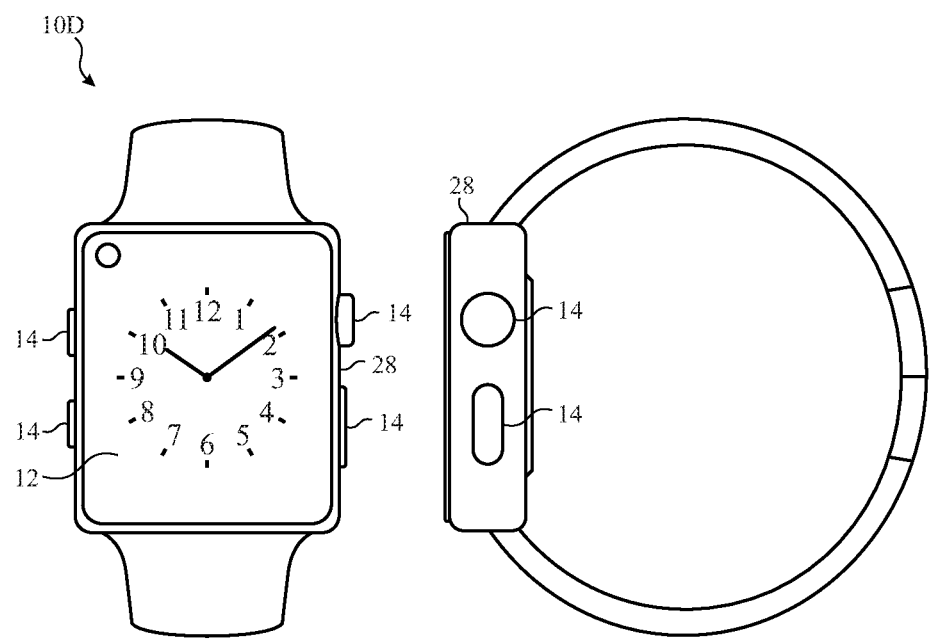
FIG. 5 is another example of the electronic device of FIG. 1, in accordance with an embodiment of the present disclosure.

To help further illustrate, another example of a suitable electronic device 10, specifically a tablet electronic device 10B, is shown in FIG. 3. As an illustrative example, the tablet electronic device 10B may be any iPad® model available from Apple Inc. A further example of a suitable electronic device 10, specifically a computer 10C, is shown in FIG. 4. As an illustrative example, the computer 10C may be any MacBook® or iMac® model available from Apple Inc. Another example of a suitable electronic device 10, specifically a watch 10D, is shown in FIG. 5. As an illustrative example, the watch 10D may be any Apple Watch® model available from Apple Inc.

As depicted, the tablet electronic device 10B, the computer 10C, and the watch 10D each also include an electronic display 26, input devices 14, I/O ports 16, and an enclosure 28. In some embodiments, at least a portion of a radio frequency system 12 may also be enclosed within the enclosure 28 and, thus, internal to the tablet electronic device 10B, the computer 10C, and/or the watch 10D. As described above, a radio frequency system 12 may facilitate wirelessly communicating data with other electronic devices and/or a communication network.

Figure 6:
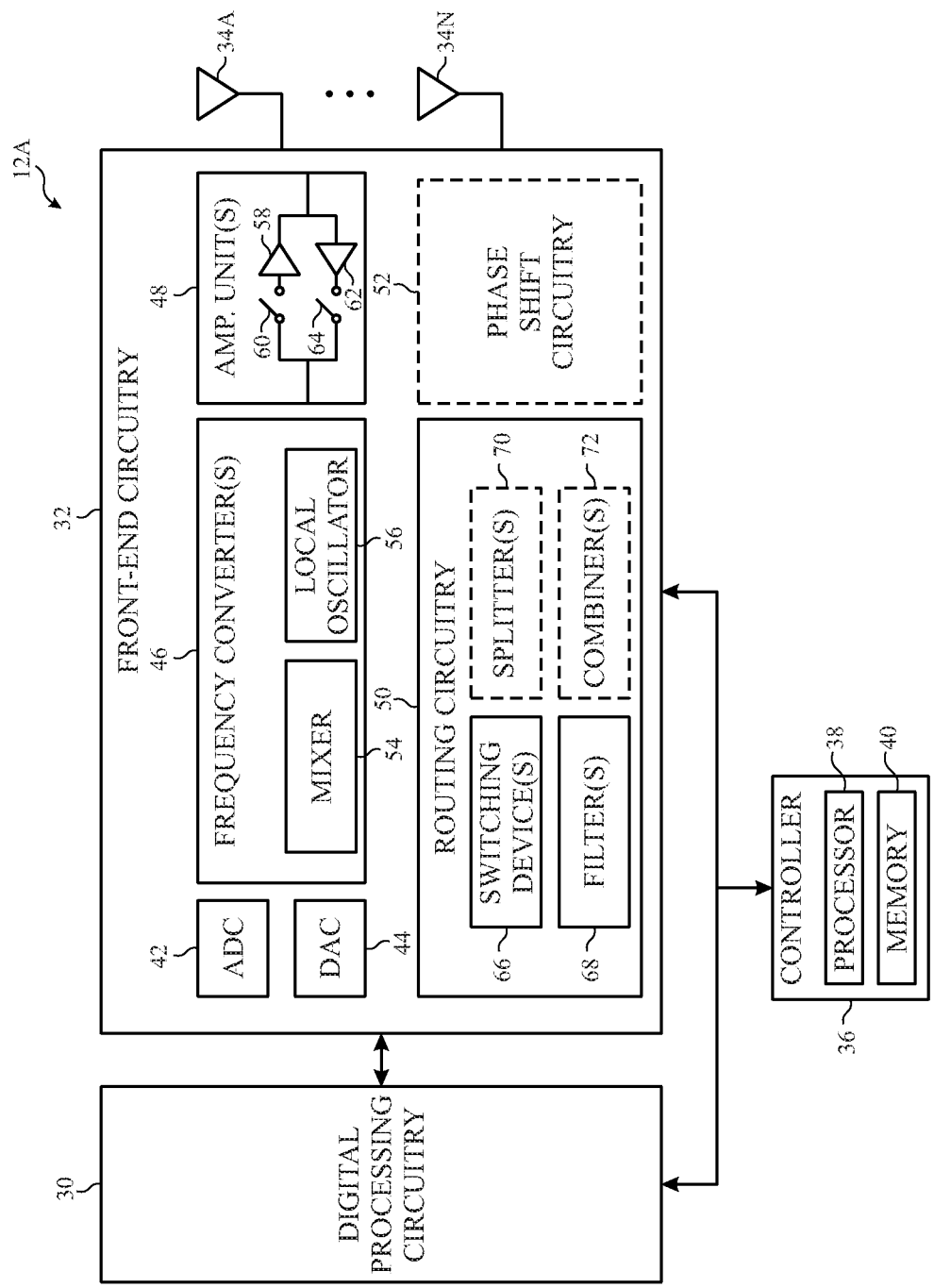
FIG. 6 is block diagram of a portion of the radio frequency system of FIG. 1 including front-end circuitry and antennas, in accordance with an embodiment of the present disclosure.

To help illustrate, an example of a radio frequency system 12A, which may be implemented in an electronic device 10, is shown in FIG. 6. As in the depicted example, a radio frequency system 12 may include digital processing circuitry 30, front-end circuitry 32, one or more antennas 34, and a controller 36. It should be appreciated that the depicted example is merely intended to be illustrative and not limiting. For example, in other embodiments, a radio frequency system 12 may include a single antenna 34 or more than two antennas 34.

The controller 36 may generally control operation of the radio frequency system 12. Although depicted as a single controller 36, in other embodiments, one or more separate controllers 36 may be used to control operation of the radio frequency system 12. To facilitate controlling operation, the controller 36 may include one or more controller processors 38 and/or controller memory 40. In some embodiments, a controller processor 38 may execute instructions and/or process data stored in the controller memory 40 to determine control commands that instruct the radio frequency system 12 to perform a control action. Additionally or alternatively, a controller processor 38 may be hardwired with instructions that determine control commands when executed. Furthermore, in some embodiments, a controller processor 38 may be included in the processor core complex 18, separate processing circuitry, or both and the controller memory 40 may be included in local memory 24, main memory storage device 20, another tangible, non-transitory computer-readable medium, or any combination thereof.

Digital processing circuitry 30 implemented in a radio frequency system 12 may generally operate in a digital domain. In other words, the digital processing circuitry 30 may process data indicated via digital electrical signals, for example, which indicate "0" bits when voltage is below a voltage threshold and "1" bits when voltage is above the voltage threshold. Thus, in some embodiments, the digital processing circuitry 30 may include a modem, a baseband processor, and/or the like. Additionally, in some embodiments, the digital processing circuitry 30 may be communicatively coupled to the processor core complex 18 to enable the electronic device 10 to wirelessly transmit data and/or receive wirelessly transmitted data via the radio frequency system 12.

On the other hand, antennas 34 implemented in a radio frequency system 12 generally operate in an analog domain. For example, an antenna 34 may facilitate wireless data transmission by modulating electromagnetic (e.g., radio) waves based at least in part on an analog electrical signal received from the front-end circuitry 32. Additionally or alternatively, an antenna 34 may facilitate wireless data reception by outputting an analog electrical signal based at least in part on received (e.g., incident) electromagnetic waves.

As described above, in some embodiments, a radio frequency system 12 may include multiple antennas 34, for example, to facilitate improving operational flexibility, communication bandwidth, transmission distance, and/or communication reliability of radio frequency system 12. As an illustrative example, a first antenna 34A may be implemented to communicate with a first (e.g., LTE) communication network while an Nth antenna 34N is implemented to communicate with a second (e.g., mmWave or different) communication network, thereby improving operational flexibility and/or communication bandwidth, for example, by enabling the radio frequency system 12 to selectively and/or concurrently (e.g., simultaneously) communicate with multiple different communication networks. Additionally or alternatively, the first antenna 34A may be implemented to communicate a first (e.g., horizontally polarized) data stream while an Nth antenna 34N is implemented to communicate a second (e.g., vertically polarized) data stream, thereby improving communication bandwidth, for example, by enabling the radio frequency system 12 to concurrently communicate multiple different data streams.

Furthermore, in some embodiments, the first antenna 34A and the Nth antenna 34N may be implemented in an antenna array, for example, to enable beam forming techniques, which, at least in some instances, may facilitate improving transmission distance and, thus, communication reliability of radio frequency system 12. Nevertheless, it should be appreciated that the depicted example is merely intended to be illustrative and not limiting. For example, in other embodiments, a radio frequency system 12 may be implemented with a single antenna 34 or more than two antennas 34.

As in the depicted example, the front-end circuitry 32 may be coupled between the digital processing circuitry 30 and the antennas 34 and, thus, operate as an interface between the digital domain and the analog domain. Thus, as in the depicted example, the front-end circuitry 32 may include an analog-to-digital converter (ADC) 42 that operates to convert an analog electrical signal (e.g., output from an antenna 34) into a digital electrical signal (e.g., to be output to the digital processing circuitry 30). Additionally, as in the depicted example, the front-end circuitry 32 may include a digital-to-analog converter (DAC) 44 that converts a digital electrical signal (e.g., output from the digital processing circuitry 30) into an analog electrical signal (e.g., to be output to an antenna 34).

In addition to the analog-to-digital converter 42 and the digital-to-analog converter 44, as in the depicted example, the front-end circuitry 32 may include one or more frequency converters 46, one or more amplifier units 48, and routing circuitry 50. In some embodiments, the radio frequency system 12 may also include phase shift circuitry 52, for example, to facilitate implementing beam forming techniques. In other words, in other embodiments, the phase shift circuitry 52 may be obviated (e.g., optional), for example, when the radio frequency system 12 does not implement beam forming techniques.

A frequency converter 46 implemented in front-end circuitry 32 of a radio frequency system 12 generally operates to convert an analog electrical signal from a first frequency to a second (e.g., different) frequency. For example, a frequency converter 46 may convert between a processing (e.g., baseband) frequency used by the digital processing circuitry 30 and a communication (e.g., carrier) frequency used by an antenna 34. Additionally or alternatively, a first frequency converter 46 may convert between the processing frequency and an intermediate frequency, which is between the processing frequency and the communication frequency, while a second frequency converter 46 converts between the intermediate frequency and the communication frequency.

To facilitate converting frequency, as in the depicted example, a frequency converter 46 may include a mixer 54 and a local oscillator 56. In some embodiments, the local oscillator 56 may generate a local oscillator signal, for example, with a frequency that matches a target frequency to which an analog electrical signal is to be converted. Based at least in part on the local oscillator signal, the mixer 54 may up convert or down convert frequency of an analog electrical signal, for example, by modulating the local oscillator signal based on the analog electrical signal.

Additionally, an amplifier unit 48 implemented in front-end circuitry 32 of a radio frequency system 12 generally operates to amplify magnitude (e.g., amplitude, strength, and/or power) of an analog electrical signal, for example, to facilitate overcoming communication (e.g., propogation and/or connector) loses. Thus, as in the depicted example, an amplifier unit 48 may include a transmit (e.g., power) amplifier 58 selectively connectable via a transmit amplifier switching device 60 and a receipt (e.g., low noise) amplifier 62 selectively connectable via a receipt amplifier switching device 64. In some embodiments, the transmit amplifier switching device 60 and/or the receipt amplifier switching device 64 may be a semiconductor switching device, such as a metal-oxide-semiconductor field-effect transistor (MOSFET).

However, it should again be appreciated that the depicted example is merely intended to be illustrative and not limiting. For example, in some embodiments, front-end circuitry 32 may include one or more transmit amplifier units 48, which each includes a transmit amplifier 58 selectively connectable via a transmit amplifier switching device 60, but not a receipt amplifier 62 or a receipt amplifier switching device 64. Additionally or alternatively, front-end circuitry 32 may include one or more receipt amplifier units 48, which each includes a receipt amplifier 62 selectively connectable via a receipt amplifier switching device 64, but not a transmit amplifier 58 or a transmit amplifier switching device 60. Furthermore, in some embodiments, an amplifier unit 48 may include a selectively connectable bypass path, which bypasses its transmit amplifier 58 and/or its receipt amplifier 62 when connected.

Routing circuitry 50 implemented in front-end circuitry 32 of a radio frequency system 12 generally operates to route analog electrical signals to appropriate destinations in the radio frequency system 12. To facilitate routing, as in the depicted example, the routing circuitry 50 may include one or more routing switching devices 66 and one or more filters 68. In some embodiments, one or more of the routing switching devices 66 may be implemented in a multiplexer or a de-multiplexer. Additionally, in some embodiments, the routing switching devices 66 may include a time division duplex (TDD) switch or a frequency division duplex (FDD) switch, for example, which selectively switches between transmission (e.g., uplink) and reception (e.g., downlink). Furthermore, in some embodiments, one or more of the routing switching devices 66 may be a semiconductor switching device, such as a metal-oxide-semiconductor field-effect transistor (MOSFET).

As described above, in some embodiments, a filter 68 may operate to remove noise from an analog electrical signal, for example, by attenuating frequencies outside a target communication frequency or band. Thus, in some embodiments, the filters 68 may include one or more bandpass filters. Additionally or alternatively, a filter 68 may operate to facilitate separating an analog electrical signal into frequency components, for example, when the radio frequency system 12 is implemented to communicate a data stream via multiple different communication (e.g., transmission and/or reception) frequencies.

When the radio frequency system 12 is implemented to communicate a data stream via multiple different communication frequencies, in some embodiments, the routing circuitry 50 may include one or more splitters 70 and one or more combiners 72. In other embodiments, the splitters 70 and/or the combiners 72 may be obviated (e.g., optional), for example, when the radio frequency system 12 is not implemented to communicate a data stream via multiple different communication frequencies. A splitter 70 implemented in front-end circuitry 32 of a radio frequency system 12 generally operates to supply the same analog electrical signal to multiple different destinations. On the other hand, a combiner 72 implemented in front-end circuitry 32 of a radio frequency system 12 generally operates to combine analog electrical signals received from multiple different sources into a single analog electrical signal, for example, which includes multiple different frequency components.

As described above, in some embodiments, the front-end circuitry 32 may be implemented across multiple integrated circuits (e.g., devices or chips). For example, the analog-to-digital converter 42 and the digital-to-analog converter (DAC) 44 may be implemented in a transceiver integrated circuit. Additionally or alternatively, a first one or more amplifier units 48 may be implemented on a transceiver-side (e.g., in the transceiver integrated circuit and/or a separate buffer integrated circuit or module) and a second one or more amplifier units 48 may be implemented on an antenna-side (e.g., in an antenna integrated circuit or module).

Figure 7:
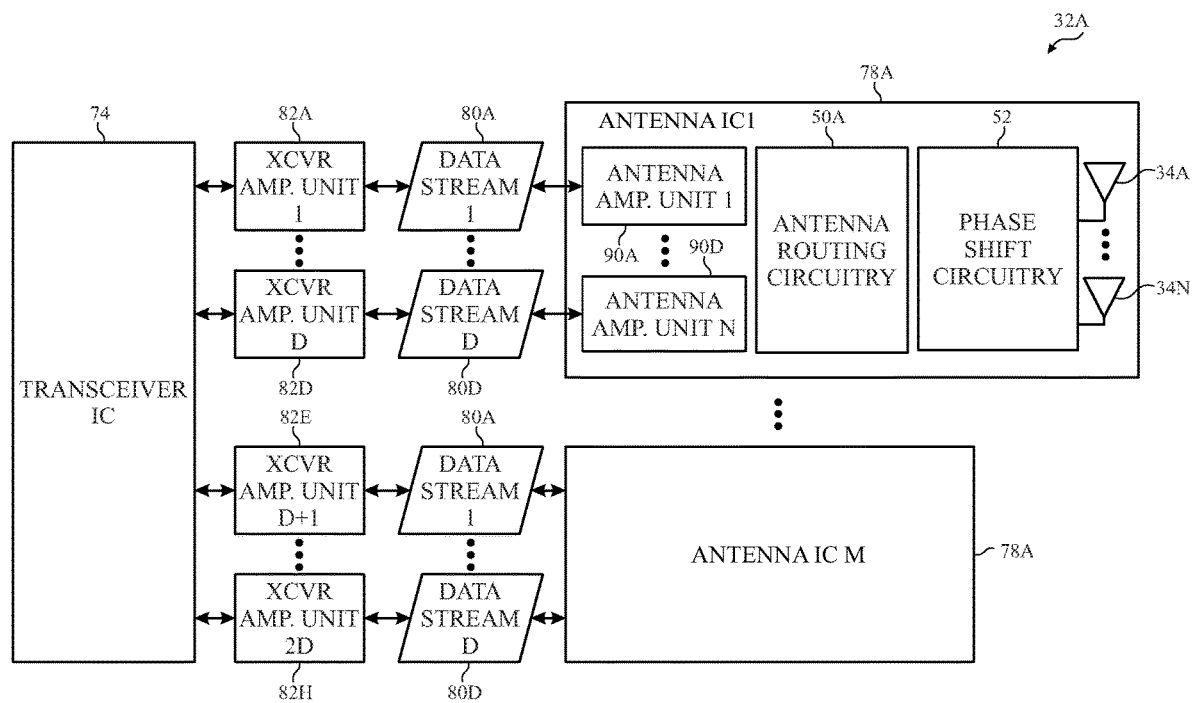
FIG. 7 is a block diagram of an example of the front-end circuitry of FIG. 6 implemented in a transceiver integrated circuit (IC), transceiver amplifier (e.g., buffer) units (e.g., assemblies or devices), and antenna integrated circuits, in accordance with an embodiment of the present disclosure.

To help illustrate, an example of front-end circuitry 32A, which may be implemented in a radio frequency system 12, is shown in FIG. 7. As depicted, the front-end circuitry 32A is implemented in a transceiver integrated circuit (IC) 74 and multiple antenna integrated circuits 78—namely a first antenna integrated circuit 78A and an Mth antenna integrated circuit 78M. Additionally, as in the depicted example, the front-end circuitry 32A may be implemented to enable concurrent (e.g., simultaneous) communication of multiple data streams 80—namely a first data stream 80A and a Dth data stream 80D.

However, it should be appreciated that the depicted example is merely intended to be illustrative and not limiting. For example, in other embodiments, front-end circuitry 32 may be implemented in a single antenna integrated circuit 78 or more than two antenna integrated circuits 78. Additionally or alternatively, in other embodiments, front-end circuitry 32 may be implemented to communicate a single data stream 80 or more than two data streams 80.

To enable concurrent communication of multiple data streams 80, as in the depicted example, the front-end circuitry 32 may include multiple transceiver (XCVR) amplifier (e.g., buffer) units (e.g., assemblies) 82. In some embodiments, each transceiver amplifier unit 82 may be dedicated to amplifying analog electrical signals communicated via a corresponding data stream 80. For example, the transceiver amplifier units 82 (e.g., implemented in the transceiver integrated circuit 74 or a separate integrated circuit) may include a first transceiver amplifier unit 82A implemented to amplify analog electrical signals communicated via the first data stream 80A and a Dth transceiver amplifier unit 82D implemented to amplify analog electrical signals communicated via the Dth data stream 80D. Additionally, transceiver amplifier units 82 may include a D+1th transceiver amplifier unit 82E implemented to amplify analog electrical signals communicated via the first data stream 80A and a 2Dth transceiver amplifier unit 82H implemented to amplify analog electrical signals communicated via the Dth data stream 80D.

Moreover, in some embodiments, each transceiver amplifier unit 82 may be dedicated to amplifying analog electrical signals communicated with a corresponding antenna integrated circuit 78. In other words, to facilitate concurrently communicating with multiple antenna integrated circuits 78, multiple sets of transceiver amplifier units 84 may each dedicated to amplifying analog electrical signals communicated with a corresponding antenna integrated circuit 78. For example, a first set, which includes the first transceiver amplifier unit 82A and the Dth transceiver amplifier unit 82D, may be implemented to amplify analog electrical signal communicated with the first antenna integrated circuit 78A. Additionally, an Mth set, which includes the D+1th transceiver amplifier unit 82E and the 2Dth transceiver amplifier unit 82H, may be implemented to amplify analog electrical communicated with the Mth antenna integrated circuit 78M.

As in the depicted example, an antenna integrated circuit 78 may include multiple antennas 34. For example, the first antenna integrated circuit 78A includes a first antenna 34A and an Nth antenna 34N. In some embodiments, each antenna integrated circuit 78 may include four antennas 34. In other words, in such embodiments, the first antenna integrated circuit 78A may additionally include a second antenna 34 and a third antenna 34. Nevertheless, it should be appreciated that the depicted example is merely intended to be illustrative and not limiting. For example, in other embodiments, an antenna integrated circuit 78 may include a single antenna 34, two antennas 34, three antennas, or more than four antennas 34.

As described above, in some embodiments, a radio frequency system 12 may include multiple antennas 34 to facilitate communicating at multiple different frequencies. For example, the first antenna 34A may be implemented to communicate via a first (e.g., 28 GHz or 24.25-29.5 GHz) frequency and the Nth antenna 34N may be implemented to communicate via a second (e.g., 39 GHz or 37-43.5 GHz) frequency. Additionally or alternatively, multiple antennas 34 may be implemented to communicate via the same frequency, for example, to facilitate implementing beam forming techniques. In other words, continuing with the above example, a second antenna 34 on the first antenna integrated circuit 78A may also be implemented to communicate via the second frequency and a third antenna 34 on the first antenna integrated circuit 78A may be implemented to communicate via the first frequency.

As described above, phase shift circuitry 52 may facilitate implementing beam forming techniques, for example, by generating and/or supplying phase shifted versions of an analog electrical signal to multiple antennas 34 such that additive and/or destructive interference in resulting electromagnetic waves produces a beam (e.g., concentrated strength) oriented in a target direction (e.g., cellular tower or access point). In other words, continuing with the above example, a first version of a first (e.g., 28 GHz or 24.25-29.5 GHz) analog electrical signal may be supplied to the first antenna 34A and a second version of the first analog electrical signal, which is phase shifted relative to the first version, may be supplied to the third antenna 34. Additionally or alternatively, a first version of a second (e.g., 39 GHz or 37-43.5 GHz) analog electrical signal may be supplied to the second antenna 34 and a second version of the second analog electrical signal, which is phase shifted relative to the first version, may be supplied to the Nth (e.g., fourth) antenna 34N.

It should be appreciated that the depicted example is merely intended to be illustrative and not limiting. For example, as described above, in other embodiments, the phase shift circuitry 52 may be obviated. Moreover, in other embodiments, phase shift circuitry 52 may additionally or alternatively be implemented in the transceiver integrated circuit 74, the digital processing circuitry 30, or both.

As described above, in some embodiments, an antenna 34 may be implemented to enable multiple data streams 80 to be concurrently (e.g., simultaneously) communicated therethrough, for example, by polarizing corresponding electromagnetic waves. As an illustrative example, the first antenna 34A may be implemented to communicate the first data stream 80A via horizontally polarized electromagnetic waves and the Dth (e.g., second) data stream 80D via vertically polarized electromagnetic waves. Additionally or alternatively, the Nth antenna 34N may be implemented to communicate the first data stream 80A via horizontally polarized electromagnetic waves and the Dth (e.g., second) data stream 80D via vertically polarized electromagnetic waves.

To facilitate concurrently communicating multiple data streams 80, as in the depicted example, an antenna integrated circuit 78 may include multiple antenna amplifier (e.g., buffer) units (e.g., assemblies) 90. Similar to the transceiver amplifier units 82, in some embodiments, each antenna amplifier unit 90 may be dedicated to amplifying analog electrical signals communicated via a corresponding data stream 80. For example, the first antenna integrated circuit 78A may include a first antenna amplifier unit 90A implemented to amplify analog electrical signals communicated with the first antenna 34A in the first data stream 80A and a Dth antenna amplifier unit 90D implemented to amplify analog electrical signals communicated with the Nth antenna 34N in the Dth data stream 80D.

To facilitate concurrently communicating multiple data streams 80 via an antenna 34, in some embodiments, multiple antenna amplifier units 90 may be dedicated to amplifying analog electrical signals communicated with the antenna 34. For example, to facilitate concurrently communicating the Dth data stream 80D via the first antenna 34A, the first antenna integrated circuit 78A may additionally include a second antenna amplifier unit 90 implemented to amplify analog electrical signals communicated with the first antenna 34A in the Dth data stream 80D. Additionally or alternatively, to facilitate concurrently communicating the first data stream 80A via the Nth antenna 34N, the first antenna integrated circuit 78A may include an D−1th antenna amplifier unit 90 implemented to amplify analog electrical signals communicated with the Nth antenna 34N in the first data stream 80A.

As described above, in some embodiments, routing circuitry 50 may be implemented in front-end circuitry 32 of a radio frequency system 12 to facilitate routing electrical signals to appropriate destinations. For example, routing circuitry 50 may be implemented in an antenna integrated circuit 78 as antenna routing circuitry 50A. In some embodiments, antenna routing circuitry 50A may filter an input analog electrical signal (e.g., received from a transceiver amplifier unit 84 and/or an antenna 34) to attenuate noise and/or to separate the input analog electrical signals into frequency components. Additionally, in some embodiments, the antenna routing circuitry 50A may split an analog electrical signal to multiple antenna amplifier units 90 and/or combine analog electrical signals output from multiple antenna amplifier units 90. Furthermore, in some embodiments, the antenna routing circuitry 50A may route analog electrical signals output from the antenna amplifier units 90 to appropriate antennas 34 and/or route analog electrical signals output from the antennas 34 to appropriate antenna amplifier units 90.

As described above, at least in some instances, an antenna integrated circuit 78 may be separated from the transceiver integrated circuit 74 and, thus, the transceiver amplifier units 82 by some distance, for example, when multiple antenna integrated circuits 78 are implemented at disparate locations in an electronic device 10. Thus, in such instances, one or more electrical connectors may be coupled between the transceiver integrated circuit 74 and each antenna integrated circuit 78. In some embodiments, an electrical connector may include a wire, a cable, a conductive trace, and/or the like. Additionally, in some embodiments, each electrical connector may be dedicated to a corresponding data stream 80. Furthermore, in some embodiments, each electrical connector may be dedicated to communication with a corresponding antenna integrated circuit 78.

As described above, in some embodiments, a radio frequency system 12 may be implemented to enable concurrently communicating multiple (e.g., two or more) data streams 80. Additionally, as described above, in some embodiments, a radio frequency system 12 may include multiple (e.g., two or more) antenna integrated circuits 78. To facilitate streamlining discussion, examples of the techniques are described below with regard to embodiments implemented to concurrently communicate two data streams 80 via two antenna integrated circuits 78. However, it should be appreciated that the techniques described in the present disclosure may be applied to radio frequency systems 12 implemented to communicate a single data stream 80 or more than two data streams 80. Additionally, it should be appreciated that the techniques described in the present disclosure may be applied to radio frequency systems 12 implemented with a single antenna integrated circuit 78 or more than two antenna integrated circuits 78.

Figure 8:
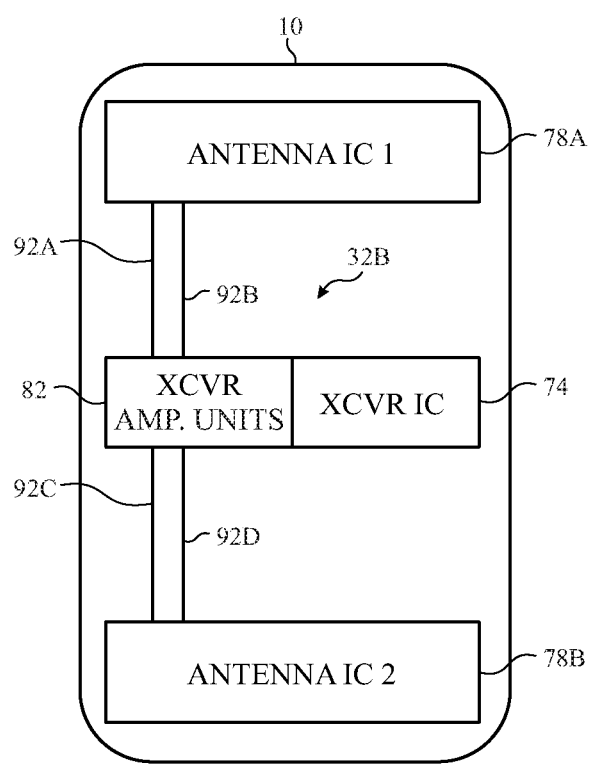
FIG. 8 is a schematic diagram of an example of the transceiver integrated circuit, the transceiver amplifier units, and two antenna integrated circuits of FIG. 7 implemented in an electronic device, in accordance with an embodiment of the present disclosure.
Figure 9:
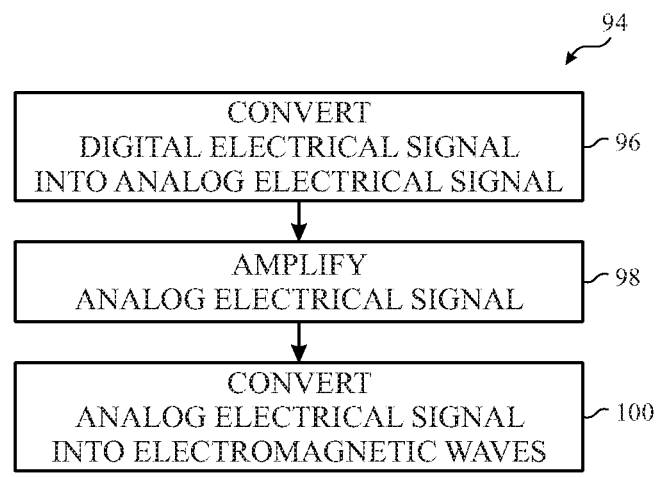
FIG. 9 is flow diagram of a process for operating the front-end circuitry of FIG. 6 in a transmission mode, in accordance with an embodiment of the present disclosure.

An example of front-end circuitry 32B implemented in an electronic device 10 to enable concurrently communicating two data streams 80—namely a first data stream 80A and a second data stream 80—via two antenna integrated circuits 78—namely a first antenna integrated circuit 78A and a second antenna integrated circuit 78B—is shown in FIG. 8. To facilitate improving wireless coverage, as in the depicted example, the first antenna integrated circuit 78A may be implemented at a first (e.g., top) end of the electronic device 10 while the second antenna integrated circuit 78B is implemented at a second (e.g., opposite or bottom) end of the electronic device 10.

Additionally, to facilitate communicating two data streams 80 via the first antenna integrated circuit 78A, as in the depicted example, the transceiver amplifier units 82 may be coupled to the first antenna integrated circuit 78A via two electrical connectors 92—namely a first electrical connector 92A and a second electrical connector 92B. In some embodiments, the first electrical connector 92A may be implemented to communicate the first data stream 80A and the second electrical connector 92B may be implemented to communicate the second data stream 80. Furthermore, to facilitate communicating two data streams 80 via the second antenna integrated circuit 78B, as in the depicted example, the transceiver amplifier units 82 may be coupled to the second antenna integrated circuit 78B via two electrical connectors 92—namely a third electrical connector 92C and a fourth electrical connector 92D. In some embodiments, the third electrical connector 92C may be implemented to communicate the first data stream 80A and the fourth electrical connector 92D may be implemented to communicate the second data stream 80.

However, as described above, an electrical connector 92 generally produce some amount of loss when an electrical signal is communicated therethrough, for example, due to its inherent impedance (e.g., resistance, capacitance, and/or inductance). Since connector loss generally varies with length of an electrical connector 92, as in the depicted example, the transceiver amplifier units 82 may be implemented at a more central location in the electronic device 10. For example, the transceiver amplifier units 82 may be positioned such that length of the first electrical connector 92A and length of the third electrical connector 92C are substantially (e.g., approximately) the same and/or length of the second electrical connector 92B and length of the fourth electrical connector 92D are substantially the same. In other words, in some embodiments, the transceiver amplifier units 82 may be implemented approximately halfway between the first antenna integrated circuit 78A and the second antenna integrated circuit 78B.

Moreover, when implemented on a separate integrated circuit, the transceiver amplifier units 82 may be implemented in close proximity to the transceiver integrated circuit 74, for example, to obviate and/or reduce length of electrical connectors 92 coupled therebetween. In other words, in some embodiments, one or more transceiver amplifier units 82 may be directly coupled to the transceiver integrated circuit 74, thereby obviating electrical connectors 92 therebetween. Additionally or alternatively, length of an electrical connector 92 coupled between the transceiver integrated circuit 74 and the transceiver amplifier units 82 may be substantially (e.g., significantly) shorter than an electrical connector 92 coupled between the transceiver amplifier units 82 and an antenna integrated circuit 78. By implementing the transceiver amplifier units 82 and the transceiver integrated circuit 74 in this manner, connector loss resulting in communication between the transceiver integrated circuit 74 and the transceiver amplifier units 82 may be substantially (e.g., one or more orders of magnitude) less than the connector loss resulting in communication between the transceiver amplifier units 82 and an antenna integrated circuit 78.

Figure 12:
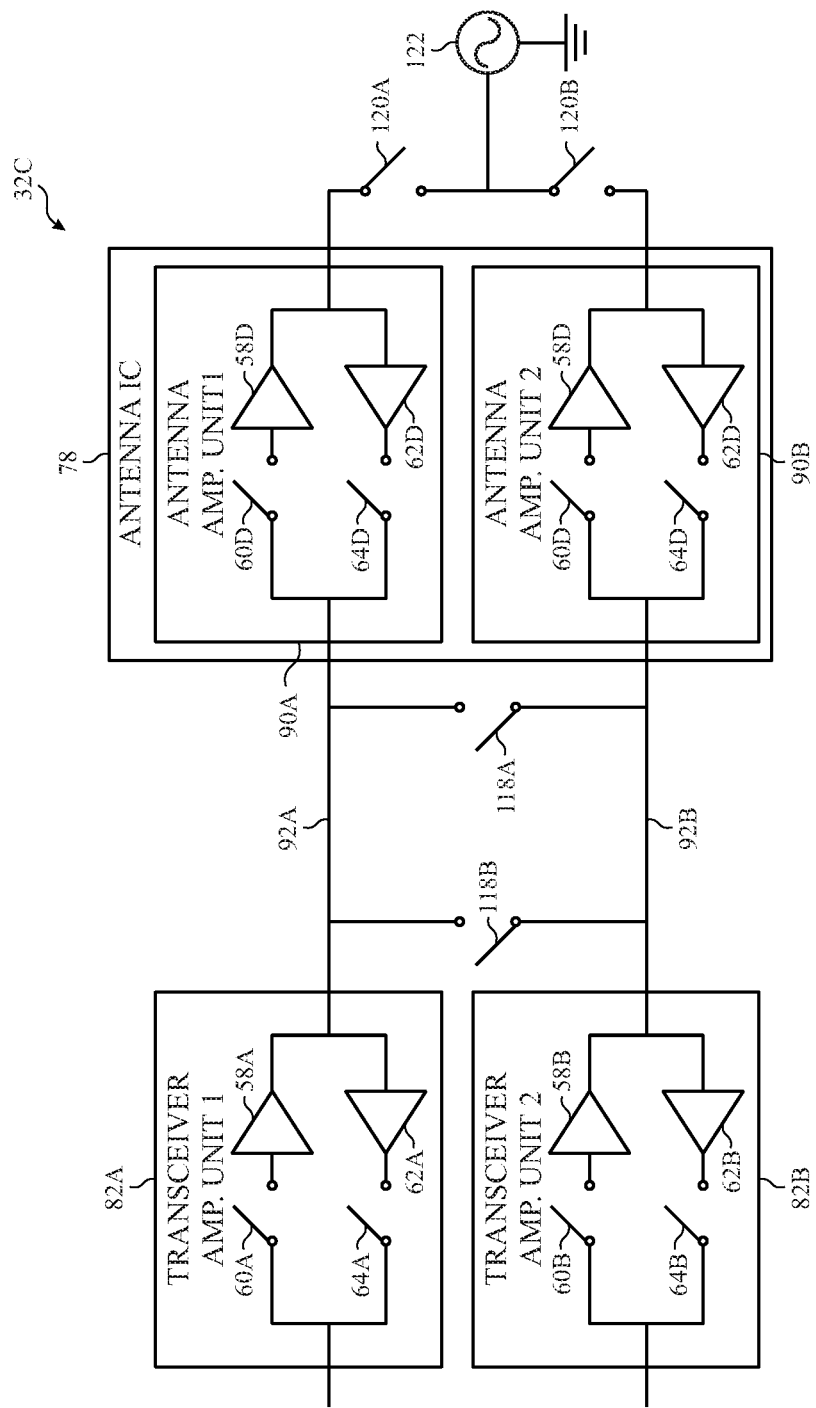
FIG. 12 is an example of a portion of the front-end circuitry of FIG. 8 implemented to facilitate calibrating the amplifier gain, in accordance with an embodiment of the present disclosure.

An example of a process 94 for operating a radio frequency system 12 during transmission is described in FIG. 12. Generally, the process 94 includes converting a digital electrical signal into an analog electrical signal (process block 96), amplifying the analog electrical signal (process block 98), and converting the analog electrical signal into electromagnetic waves (process block 100). Although described in a particular order, which represents a particular embodiment, it should be noted that the process 94 may be performed in any suitable order. Additionally, embodiments of the process 94 may omit process blocks and/or include additional process blocks. Moreover, in some embodiments, the process 94 may be implemented at least in part by executing instructions stored in a tangible, non-transitory, computer-readable medium, such as controller memory 40, using processing circuitry, such as the controller processor 38.

Accordingly, in some embodiments, a controller 36 may instruct a radio frequency system 12 to supply its front-end circuitry 32 a digital representation of data to be wirelessly transmitted as a digital electrical signal and, based on the digital electrical signal, the front-end circuitry 32 may generate an analog representation of the data as an analog electrical signal (process block 96). In some embodiments, the front-end circuitry 32 may receive the digital electrical signal from digital processing circuitry 30 (e.g., modem and/or baseband processor) implemented in the radio frequency system 12. Additionally, in some embodiments, a transceiver integrated circuit 74 included in the front-end circuitry 32 may convert the digital electrical signal to the analog electrical signal via a digital-to-analog converter 44.

The controller 36 may then instruct the front-end circuitry 32 to amplify the analog electrical signal, for example, by applying a specific transmit gain to the analog electrical signal (process block 98). As described above, an analog electrical signal may be amplified by one or more amplifier units 48, which each includes a selectively connectable transmit amplifier 58, implemented in the front-end circuitry 32. For example, a transceiver amplifier unit 82 and/or an antenna amplifier unit 90 may amplify an analog electrical signal to facilitate overcoming communication (e.g., propogation and/or connector) loss. In some embodiments, the controller 36 may instruct an amplifier unit 48 to amplify an analog electrical signal by instructing the amplifier unit 48 to connect its transmit amplifier 58, for example, by closing its transmit amplifier switching device 60 while maintaining its receipt amplifier switching device 64 open and, thus, its receipt amplifier 62 disconnected. After amplification, the controller 36 may instruct the radio frequency system 12 to route an amplified analog electrical signal to an antenna 34 and, based on the amplified analog electrical, the antenna 34 may modulate electromagnetic waves, thereby wirelessly transmitting the data (process block 100).

Figure 10:
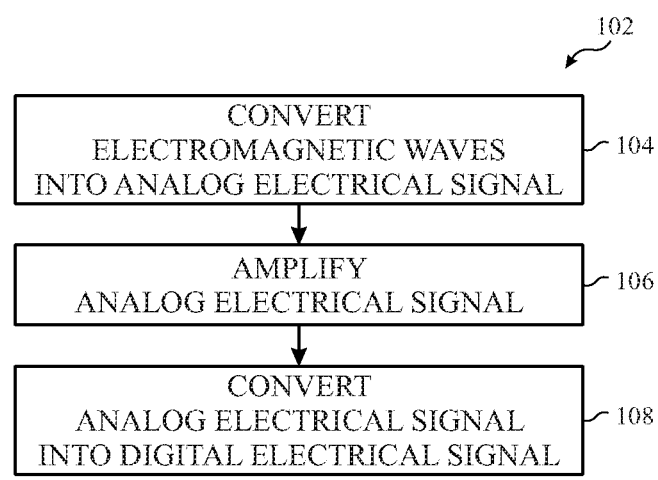
FIG. 10 is flow diagram of a process for operating the front-end circuitry of FIG. 6 in a reception mode, in accordance with an embodiment of the present disclosure.

An example of a process 102 for operating a radio frequency system 12 during reception is described in FIG. 10. Generally, the process 102 includes converting electromagnetic waves into an analog electrical signal (process block 104), amplifying the analog electrical signal (process block 106), and converting the analog electrical signal into a digital electrical signal (process block 108). Although described in a particular order, which represents a particular embodiment, it should be noted that the process 102 may be performed in any suitable order. Additionally, embodiments of the process 102 may omit process blocks and/or include additional process blocks. Moreover, in some embodiments, the process 102 may be implemented at least in part by executing instructions stored in a tangible, non-transitory, computer-readable medium, such as controller memory 40, using processing circuitry, such as the controller processor 38.

Accordingly, in some embodiments, a controller 36 may instruct a radio frequency system 12 to output an analog representation of data indicated by received electromagnetic waves to its front-end circuitry 32 as an analog electrical signal (process block 104). As described above, an antenna 34 may output an analog electrical signal based at least in part on electromagnetic waves incident on the antenna 34. In fact, in some embodiments, the analog electrical signal output to the front-end circuitry 32 may be generated by combining analog electrical signals output from multiple different antennas 34.

The controller 36 may then instruct the front-end circuitry 32 to amplify the analog electrical signal, for example, by applying a specific receipt gain to the analog electrical signal (process block 106). As described above, an analog electrical signal may be amplified by one or more amplifier units 48, which each includes a selectively connectable receipt amplifier 62, implemented in the front-end circuitry 32. For example, a transceiver amplifier unit 82 and/or an antenna amplifier unit 90 may amplify an analog electrical signal to facilitate overcoming communication (e.g., propogation and/or connector) loss. In some embodiments, the controller 36 may instruct an amplifier unit 48 to amplify an analog electrical signal by instructing the amplifier unit 48 to connect its receipt amplifier 62, for example, by closing its receipt amplifier switching device 64 while maintaining its transmit amplifier switching device 60 open and, thus, its transmit amplifier 58 disconnected.

After amplification, the controller 36 may instruct the front-end circuitry 32 to generate a digital representation of the data by converting an amplified analog electrical signal into a digital electrical signal (process block 108). As described above, in some embodiments, a transceiver integrated circuit 74 may convert the amplified analog electrical signal into the digital electrical signal via an analog-to-digital converter 42. Additionally, the radio frequency system 12 may route the digital electrical signal to its digital processing circuitry 30, thereby wirelessly receiving the data.

Thus, one or more amplifier units 48 implemented in front-end circuitry 32 of a radio frequency system 12 may apply gain (e.g., amplification) during wireless transmission and/or during wireless reception. However, as described above, operating an amplifier unit 48 to apply gain generally consumes electrical power and, thus, affects operational efficiency of the front-end circuitry 32. In fact, power consumption of an amplifier unit 48 generally increases as the gain applied by the amplifier unit 48 increases. Moreover, as described above, output power and, thus, communication distance of electromagnetic waves may depend on magnitude of an analog electrical signal supplied to an antenna 34 and, thus, transmit gain applied to achieve the magnitude.

In other words, increasing transmit gain applied in the front-end circuitry 32 may improve (e.g., increase) communication distance and, thus, communication reliability, but also increase power consumption and, thus, reduce operational efficiency. Moreover, at least in some instances, increasing transmit gain applied in the front-end circuitry 32 may increase likelihood of currently transmitted electromagnetic waves introducing noise in subsequently transmitted data, for example, due to shielding implemented in the radio frequency system 12 being finite. On the other hand, reducing transmit gain applied in the front-end circuitry 32 may reduce power consumption and, thus, improve operational efficiency, but also reduce communication distance and, thus, communication reliability. As such, in some embodiments, the gain to be applied in front-end circuitry 32 (e.g., transceiver amplifier units 82 and/or antenna amplifier units 90) may be calibrated (e.g., optimized) to balance various factors affecting communication reliability and/or operational efficiency, such as resulting power consumption, communication distance, and/or analog-to-digital converter 42 resolution.

Figure 11:
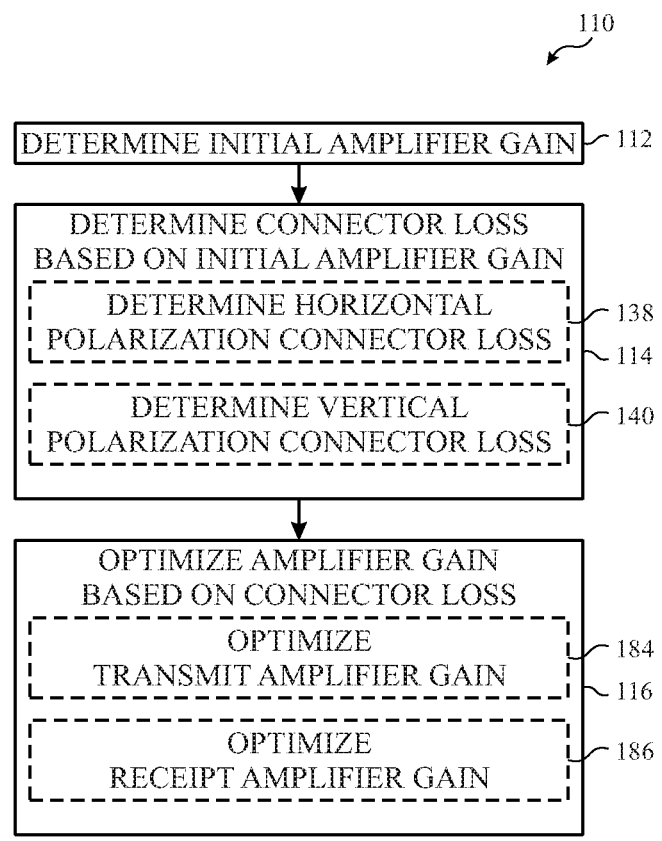
FIG. 11 is a flow diagram of a process for calibrating amplifier gain in the front-end circuitry of FIG. 6, in accordance with an embodiment of the present disclosure.

To help illustrate, an example of a process 110 for calibrating amplifier gain in front-end circuitry 32 is described in FIG. 11. Generally, the process 110 includes determining initial amplifier gain (process block 112), determining connector loss based on the initial amplifier gain (process block 114), and optimizing amplifier gain based at least in part on the connector loss (process block 116). Although described in a particular order, which represents a particular embodiment, it should be noted that the process 110 may be performed in any suitable order. Additionally, embodiments of the process 110 may omit process blocks and/or include additional process blocks. Moreover, in some embodiments, the process 110 may be implemented at least in part by executing instructions stored in a tangible, non-transitory, computer-readable medium, such as controller memory 40, using processing circuitry, such as the controller processor 38.

Accordingly, in some embodiments, a controller 36 may determine an initial gain (e.g., in decibels) of one or amplifier units 48 implemented in front-end circuitry 32 of a radio frequency system 12 (process block 112). As described above, in some embodiments, the initial gain values may be pre-determined or otherwise known. For example, the initial gain values may be stored in a tangible, non-transitory, computer-readable medium, such as the controller memory 40, during manufacture of the front-end circuitry 32 and/or integration of the radio frequency system 12. Accordingly, in such embodiments, the controller 36 may retrieve the initial gain values from the tangible, non-transitory, computer-readable medium. As described above, in other embodiments, the controller 36 may explicitly determine the initial gain values, for example, to verify the initial gain values and/or when the initial gain values are not pre-determined or otherwise know. In some embodiments, to facilitate explicitly determining the initial gain values and/or connector loss, one or more routing switching devices 66 may be coupled to electrical connectors 92 running between the transceiver amplifier units 82 and antenna amplifier units 90 implemented in an antenna integrated circuit 78.

To help illustrate, an example of a calibration portion of front-end circuitry 32C, which is implemented to enable concurrently (e.g., simultaneously) communicating two data streams 80 via an antenna integrated circuit 78, is shown in FIG. 12. As described above, in some embodiments, a radio frequency system 12 may include multiple antenna integrated circuits 78. Thus, it should be appreciated that the techniques described with reference to the antenna integrated circuit 78 may be applied to each of multiple antenna integrated circuits 78 implemented in the radio frequency system 12.

As described above, in some embodiments, each transceiver amplifier unit 82 may be dedicated to amplifying a corresponding data stream 80. Thus, to facilitate concurrently communicating two data streams, as in the depicted example, the front-end circuitry 32C may include two transceiver amplifier units 82—namely a first transceiver amplifier unit 82A and a second transceiver amplifier unit 82B. In some embodiments, the first transceiver amplifier unit 82A may be implemented to amplify analog electrical signals communicated via a first data stream 80A and the second transceiver amplifier unit 82B may be implemented to amplify analog electrical signals communicated via a second data stream 80.

Additionally, as described above, in some embodiments, each antenna amplifier unit 90 may be dedicated to amplifying a corresponding data stream 80. Thus, to facilitate concurrently communicating two data streams, as in the depicted example, the antenna integrated circuit 78 may include two antenna amplifier units 90—namely a first antenna amplifier unit 90A and a second antenna amplifier units 90B. In some embodiments, the first antenna amplifier unit 90A may be implemented to amplify analog electrical signals communicated via the first data stream 80A and the second antenna amplifier unit 90B may be implemented to amplify analog electrical signals communicated via the second data stream 80.

Furthermore, as described above, in some embodiments, each electrical connector 92 may be dedicated to communicating a corresponding data stream. Thus, to facilitate concurrently communicating two data streams, as in the depicted example, two electrical connectors 92—namely a first electrical connector 92A and a second electrical connector 92B—may be coupled between the transceiver amplifier units 82 and the antenna integrated circuit 78. In some embodiments, the first electrical connector 92A may be implemented to communicate analog electrical signals in the first data stream 80A and the second electrical connector 92B may be implemented to communicate analog electrical signals in the second data stream 80.

Moreover, as described above, an amplifier unit 48 may include a transmit (e.g., power) amplifier 58 selectively connectable via a transmit amplifier switching device 60 and/or a receipt (e.g., low noise) amplifier 62 selectively connectable via a receipt amplifier switching device 64. For example, the first transceiver amplifier unit 82A includes a first transmit amplifier 58A selectively connectable via a first transmit amplifier switching device 60A and a first receipt amplifier 62A selectively connectable via a first receipt amplifier switching device 64A. Additionally, the second transceiver amplifier unit 82B includes a second transmit amplifier 58B selectively connectable via a second transmit amplifier switching device 60B and a second receipt amplifier 62B selectively connectable via a second receipt amplifier switching device 64B. Furthermore, the first antenna amplifier unit 90A includes a third transmit amplifier 58C selectively connectable via a third transmit amplifier switching device 60C and a third receipt amplifier 62C selectively connectable via a third receipt amplifier switching device 64C. Moreover, the second antenna amplifier unit 90B includes a fourth transmit amplifier 58D selectively connectable via a fourth transmit amplifier switching device 60D and a fourth receipt amplifier 62D selectively connectable via a fourth receipt amplifier switching device 64D.

As described above, to facilitate explicitly determining the initial gain values and/or connector loss, one or more routing switching devices 66 may be coupled to electrical connectors 92 running between a transceiver integrated circuit 74 and an antenna integrated circuit 78. In some embodiments, the routing switching devices 66 may include electrical connector switching device 118 coupled between multiple electrical connectors 92. For example, a first electrical connector switching device 118A may be coupled between an antenna-side (e.g., in closer proximity to the antenna integrated circuit 78 compared to the transceiver integrated circuit 74) of the first electrical connector 92A and an antenna-side of the second electrical connector 92B. In other words, the front-end circuitry 32C may operate to selectively connect the antenna-side of the first electrical connector 92A and the antenna-side of the second electrical connector 92B via the first electrical connector switching device 118A.

Additionally, as in the depicted example, a second electrical connector switching device 118B may be coupled between a transceiver-side (e.g., in closer proximity to the transceiver integrated circuit 74 compared to the antenna integrated circuit 78) of the first electrical connector 92A and a transceiver-side of the second electrical connector 92B. In other words, the front-end circuitry 32C may operate to selectively connect the transceiver-side of the first electrical connector 92A and the transceiver-side of the second electrical connector 92B via the second electrical connector switching device 118B. As will be described in more detail below, in some embodiments, the second electrical connector switching device 118B may be obviated, for example, when initial gain values are pre-determined or otherwise known, which, at least in some instances, may facilitate reducing implementation associated cost (e.g., component count, manufacturing steps, and/or physical footprint) of front-end circuitry 32.

As described above, connector loss resulting in an electrical signal due to communication (e.g., transmission) through an electrical connector 92 is generally dependent on the length of the electrical connector 92. As such, in some embodiments, the first electrical connector switching device 118A may be coupled between the electrical connectors 92 such that the first electrical connector switching device 118A is approximately (e.g., substantially) equidistant from the first transceiver amplifier unit 82A and the second transceiver amplifier unit 82B. Additionally or alternatively, the second electrical connector switching device 118B may be coupled between the electrical connectors 92 such that the second electrical connector switching device 118B is approximately equidistant from the first transceiver amplifier unit 82A and the second transceiver amplifier unit 82B.

In addition to electrical connector switching devices 118, as in the depicted example, the routing switching devices 66 may include one or more signal generator switching devices 120 coupled between the antenna amplifier units 90 and an analog electrical signal generator 122. For example, a first signal generator switching device 120A may be coupled between the first antenna amplifier unit 90A and the analog electrical signal generator 122. In other words, the front-end circuitry 32C may operate to selectively connect the analog electrical signal generator 122 to the first antenna amplifier unit 90A via the first signal generator switching device 120A. Additionally, as in the depicted example, a second signal generator switching device 120B may be coupled between the second antenna amplifier unit 90B and the analog electrical signal generator 122. In other words, the front-end circuitry 32C may operate to selectively connect the analog electrical signal generator 122 to the second antenna amplifier unit 90B via the second signal generator switching device 120B.

Generally, the analog electrical signal generator 122 may operate to generate and output an analog electrical signal, for example, a sine wave that may be used as a test signal during the calibration (e.g., optimization) process. Thus, in some embodiments, the analog electrical signal generator 122 may be a local oscillator 56, for example, implemented in a transceiver integrated circuit 74 or a separate device connected to the front-end circuitry 32 during the calibration process. Additionally or alternatively, the analog electrical signal generator 122 may be implemented in the antenna integrated circuit 78. As will be described in more detail below, in some embodiments, a separate analog electrical signal generator 122 and, thus, the signal generator switching devices 120 may be obviated, for example, when connector loss of multiple different electrical connectors 92 is expected (e.g., assumed) to be substantially (e.g., approximately) the same, which, at least in some instances, may facilitate reducing implementation associated cost (e.g., component count, manufacturing steps, and/or physical footprint) of front-end circuitry 32.

Figure 13:
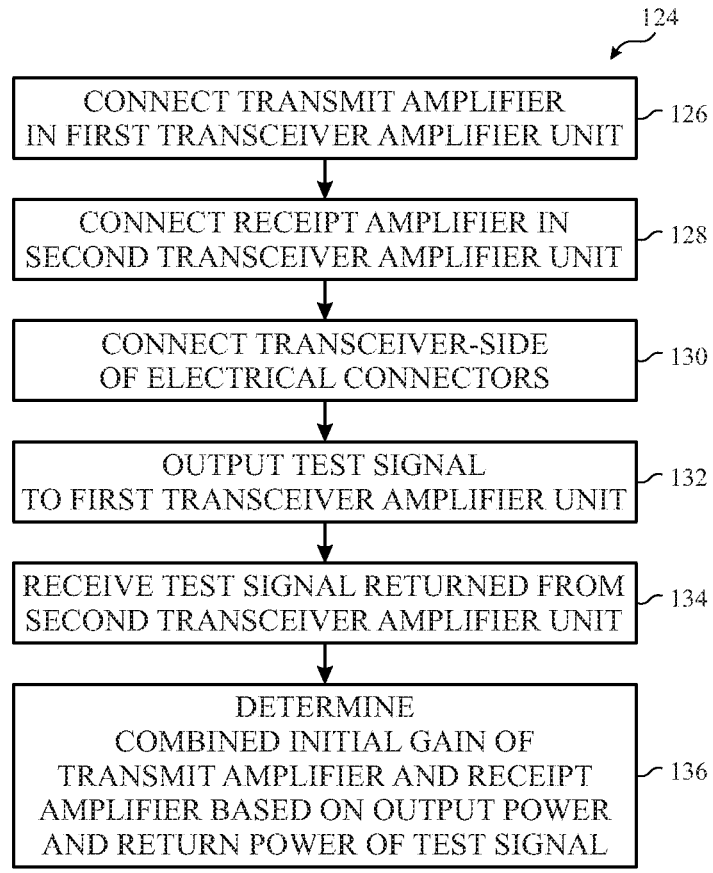
FIG. 13 is a flow diagram of an example process for operating the front-end circuitry of FIG. 8 to determine a combined initial transceiver-side gain, in accordance with an embodiment of the present disclosure.

An example of a process 124 for operating front-end circuitry 32 to facilitate determining initial gain values is described in FIG. 13. Generally, the process 124 includes connecting a transmit amplifier in a first transceiver amplifier unit (process block 126), connecting a receipt amplifier in a second transceiver amplifier unit (process block 128), connecting a transceiver-side of electrical connectors (process block 130), outputting a test signal to the first transceiver amplifier unit (process block 132), receiving the test signal returned from the second transceiver amplifier unit (process block 134), and determining a combined initial gain of the transmit amplifier and the receipt amplifier based on output power and return power of the test signal (process block 136).

Although described in a particular order, which represents a particular embodiment, it should be noted that the process 124 may be performed in any suitable order. Additionally, embodiments of the process 124 may omit process blocks and/or include additional process blocks. Moreover, in some embodiments, the process 124 may be implemented at least in part by executing instructions stored in a tangible, non-transitory, computer-readable medium, such as controller memory 40, using processing circuitry, such as the controller processor 38.

Accordingly, in some embodiments, a controller 36 may instruct front-end circuitry 32 implemented in a radio frequency system 12 to connect a first transmit amplifier 58A in a first transceiver amplifier unit 82A (process block 126). As described above, in some embodiments, a first transmit amplifier switching device 60A may operate to selectively connect the first transmit amplifier 58A in the first transceiver amplifier unit 82A. In other words, in such embodiments, the first transceiver amplifier unit 82A may connect the first transmit amplifier 58A by closing (e.g., switching to a closed position or state) the first transmit amplifier switching device 60A, for example, while maintaining its first receipt amplifier switching device 64A open (e.g., an open position or state) and, thus, its first receipt amplifier 62A disconnected.

Additionally, the controller 36 may instruct the front-end circuitry 32 to connect a second receipt amplifier 62B in a second transceiver amplifier unit 82B (process block 128). As described above, in some embodiments, a second receipt amplifier switching device 64B may operate to selectively connect the second receipt amplifier 62B in the second transceiver amplifier unit 82. In other words, in such embodiments, the second transceiver amplifier unit 82B may connect the second receipt amplifier 62B by closing the second receipt amplifier switching device 64B, for example, while maintaining its second transmit amplifier switching device 60B open and, thus, its second transmit amplifier 58B disconnected.

Furthermore, the controller 36 may instruct the front-end circuitry 32 to connect transceiver-sides of multiple electrical connectors 92 running between the transceiver amplifier units 82 and an antenna integrated circuit 78 implemented in the radio frequency system 12 (process block 130). As described above, in some embodiments, a second electrical connector switching device 118B may operate to selective connect a transceiver-side of a first electrical connector 92A coupled to the first transceiver amplifier unit 82A and a transceiver-side of a second electrical connector 92B coupled to the second transceiver amplifier unit 82B. In other words, in such embodiments, the front-end circuitry 32 may connect the transceiver-sides of the first electrical connector 92A and the second electrical connector 92B by closing second electrical connector switching device 118B, for example, for example, while maintaining a first electrical connector switching device 118A coupled between antenna-sides of the first electrical connector 92A and the second electrical connector 92B open and, thus, disconnected.

While the front-end circuitry 32 is connected in this manner, the controller 36 may instruct a transceiver integrated circuit 74 implemented in the radio frequency system 12 to output a test (e.g., analog electrical) signal to the first transceiver amplifier unit 82A, for example, with a specific or otherwise known output power (process block 132). As described above, in some embodiments, the test signal may be sine wave. Additionally, in some embodiments, the test signal may be generated and output from a local oscillator 56 implemented in the transceiver integrated circuit 74.

After output to the first transceiver amplifier unit 82A, the test signal may be amplified by the first transmit amplifier 58A, amplified by the second receipt amplifier 62B after flowing through the second electrical connector switching device 118B, and returned from the second transceiver amplifier unit 82B to the transceiver integrated circuit 74 (process block 134). In some embodiments, the controller 36 may determine return power of the test signal based at least in part on a corresponding digital electrical signal, for example, generated by an analog-to-digital converter 42 and output to the controller 36 from the transceiver integrated circuit 74. Additionally or alternatively, the controller 36 may determine the return power by measuring voltage and/or current of the test signal output from the second transceiver amplifier unit 82B via one or more sensors. Since the electrical connectors 92 are connected on their transceiver-sides, connector loss resulting in communication between the first transceiver amplifier unit 82A and the second transceiver amplifier unit 82B may be negligible (e.g., approximately zero) and, thus, power changes in the test signal may be predominantly (e.g., completely) produced by gain (e.g., amplification) applied by the first transmit amplifier 58A and the second receipt amplifier 62B.

As such, based at least in part on the output power and the return power of the test signal, the controller 36 may determine a combined initial gain of the first transmit amplifier 58A implemented in the first transceiver amplifier unit 82A and the second receipt amplifier 62B implemented in the second transceiver amplifier unit 82B (process block 136). For example, the controller 36 may determine the combined initial gain (e.g., in decibels) by subtracting the return power of the test signal from its output power. In this manner, initial amplifier gain values of one or more amplifier units 48 implemented in front-end circuitry 32 of a radio frequency system 12 may be determined.

Returning to the process 110 of FIG. 11, based at least in part on the initial amplifier gain values, the controller 36 may determine connector loss (e.g., in decibels) of one or more electrical connectors 92 implemented in the front-end circuitry 32 (process block 114). As described above, in some embodiments, a radio frequency system 12 may polarize data streams 80 relative to one another to enable concurrent communication of multiple data streams 80. For example, the radio frequency system 12 may horizontally polarize a first data stream 80A and vertically polarize a second data stream 80 to enable concurrent communication of the first data stream 80A and the second data stream 80.

Thus, in some embodiments, determining connector loss may include determining a horizontal polarization connector loss (process block 138). In other words, when a first electrical connector 92A is implemented to communicate the first data stream 80A, the horizontal polarization connector loss may be the connector loss resulting in communication via the first electrical connector 92A. Additionally or alternatively, determining connector loss may include determining a vertical polarization connector loss (process block 140). In other words, when a second electrical connector 92B is implemented to communicate the second data stream 80, the vertical polarization connector loss may be the connector loss resulting in communication via the second electrical connector 92B.

Figure 14:
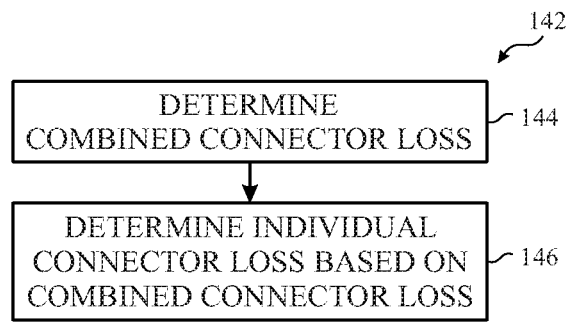
FIG. 14 is a flow diagram of an example process for determining connector loss, in accordance with an embodiment of the present disclosure.

An example of a process 142 for determining connector loss of one or more electrical connectors 92 is described in FIG. 14. Generally, the process 142 includes determining a combined connector loss (process block 144) and determining an individual connector loss based on the combined connector loss (process block 146). Although described in a particular order, which represents a particular embodiment, it should be noted that the process 142 may be performed in any suitable order. Additionally, embodiments of the process 142 may omit process blocks and/or include additional process blocks. Moreover, in some embodiments, the process 142 may be implemented at least in part by executing instructions stored in a tangible, non-transitory, computer-readable medium, such as controller memory 40, using processing circuitry, such as the controller processor 38.

Accordingly, in some embodiments, a controller 36 may determine a combined connector loss (e.g., in decibels) of multiple electrical connectors 92 implemented in front-end circuitry 32 of a radio frequency system 12 (process block 144). In some embodiments, the combined connector loss may include the connector loss of multiple electrical connectors 92 coupled between a transceiver integrated circuit 74 and an antenna integrated circuit 78 implemented in the radio frequency system 12. For example, with regard to FIG. 12, the controller 36 may determine the combined connector loss of the first electrical connector 92A and the second electrical connector 92B.

Figure 15:
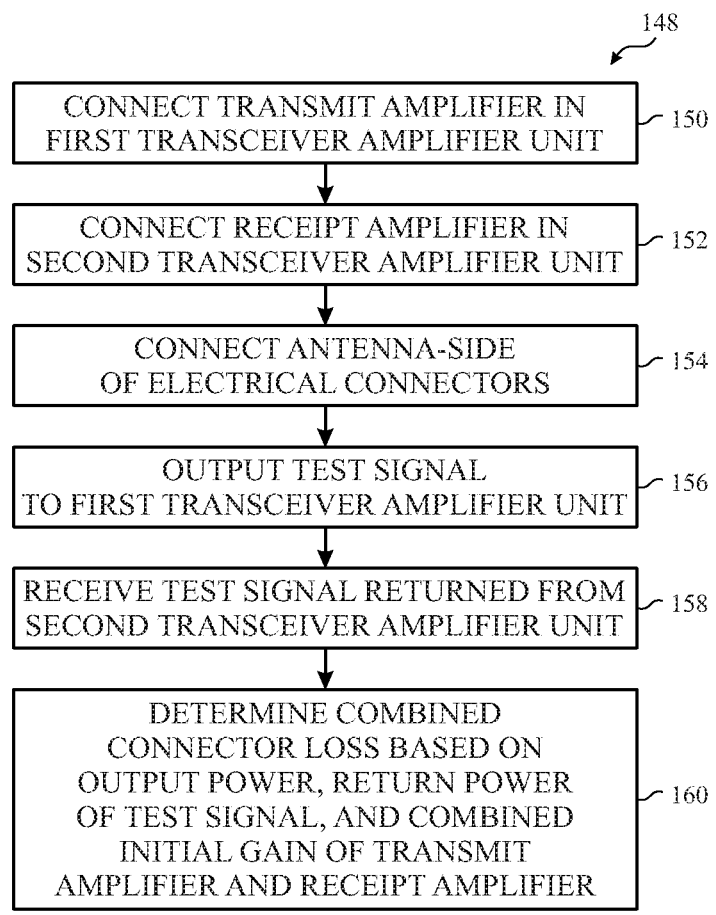
FIG. 15 is a flow diagram of an example process for operating the front-end circuitry of FIG. 8 to determine a combined connector loss, in accordance with an embodiment of the present disclosure.

An example of a process 148 for determining a combined connector loss of multiple electrical connectors 92 is described in FIG. 15. Generally, the process 148 includes connecting a transmit amplifier in a first transceiver amplifier unit (process block 150), connecting a receipt amplifier in a second transceiver amplifier unit (process block 152), connecting an antenna-side of electrical connectors (process block 154), outputting a test signal to the first transceiver amplifier unit (process block 156), receiving the test signal returned from the second transceiver amplifier unit (process block 158), and determining a combined connector loss based on output power of the test signal, return power of the test signal, and a combined initial gain of the transmit amplifier and the receipt amplifier (process block 160).

Although described in a particular order, which represents a particular embodiment, it should be noted that the process 148 may be performed in any suitable order. Additionally, embodiments of the process 148 may omit process blocks and/or include additional process blocks. Moreover, in some embodiments, the process 148 may be implemented at least in part by executing instructions stored in a tangible, non-transitory, computer-readable medium, such as controller memory 40, using processing circuitry, such as the controller processor 38.

Accordingly, in some embodiments, a controller 36 may instruct front-end circuitry 32 implemented in a radio frequency system 12 to connect a first transmit amplifier 58A in a first transceiver amplifier unit 82A (process block 150). As described above, in some embodiments, a first transmit amplifier switching device 60A may operate to selectively connect the first transmit amplifier 58A in the first transceiver amplifier unit 82A. In other words, in such embodiments, the first transceiver amplifier unit 82A may connect the first transmit amplifier 58A by closing (e.g., switching to a closed position or state) the first transmit amplifier switching device 60A, for example, while maintaining its first receipt amplifier switching device 64A open (e.g., an open position or state) and, thus, its first receipt amplifier 62A disconnected.

Additionally, the controller 36 may instruct the front-end circuitry 32 to connect a second receipt amplifier 62B in a second transceiver amplifier unit 82B (process block 152). As described above, in some embodiments, a second receipt amplifier switching device 64B may operate to selectively connect the second receipt amplifier 62B in the second transceiver amplifier unit 82B. In other words, in such embodiments, the second transceiver amplifier unit 82B may connect the second receipt amplifier 62B by closing the second receipt amplifier switching device 64B, for example, while maintaining its second transmit amplifier switching device 60B open and, thus, its second transmit amplifier 58B disconnected.

Furthermore, the controller 36 may instruct the front-end circuitry 32 to connect antenna-sides of multiple electrical connectors 92 running between the transceiver amplifier units 82 and an antenna integrated circuit 78 implemented in the radio frequency system (process block 154). As described above, in some embodiments, a first electrical connector switching device 118A may operate to selective connect an antenna-side of a first electrical connector 92A coupled to the first antenna amplifier unit 90A and an antenna-side of a second electrical connector 92B coupled to the second antenna amplifier unit 90B. In other words, in such embodiments, the front-end circuitry 32 may connect the antenna-sides of the first electrical connector 92A and the second electrical connector 92B by closing the first electrical connector switching device 118A, for example, while maintaining a second electrical connector switching device 118B coupled between transceiver-sides of the first electrical connector 92A and the second electrical connector 92B open and, thus, disconnected.

While the front-end circuitry 32 is connected in this manner, the controller 36 may instruct a transceiver integrated circuit 74 implemented in the radio frequency system 12 to output a test (e.g., analog electrical) signal to the first transceiver amplifier unit 82A, for example, with a specific or otherwise known output power (process block 156). As described above, in some embodiments, the test signal may be sine wave. Additionally, in some embodiments, the test signal may be generated and output from a local oscillator 56 implemented in the transceiver integrated circuit 74.

After output to the first transceiver amplifier unit 82A, the test signal may be amplified by the first transmit amplifier 58A, amplified by the second receipt amplifier 62B after flowing through the first electrical connector 92A, the first electrical connector switching device 118A, and the second electrical connector 92B, and returned from the second transceiver amplifier unit 82B to the transceiver integrated circuit 74 (process block 158). In some embodiments, the controller 36 may determine return power of the test signal based at least in part on a corresponding digital electrical signal, for example, generated by an analog-to-digital converter 42 and output to the controller 36 from the transceiver integrated circuit 74. Additionally or alternatively, the controller 36 may determine the return power by measuring voltage and/or current of the test signal output from the second transceiver amplifier unit 82B via one or more sensors.

Since the electrical connectors 92 are connected on their antenna transceiver-sides, connector loss resulting in communication between the first transceiver amplifier unit 82A and the second transceiver amplifier unit 82B may be the combined connector loss of the first electrical connector 92A and the second electrical connector 92B. In other words, power changes in the test signal may result from the combined connector loss of the first electrical connector 92A and the second electrical connector 92B as well as gain (e.g., amplification) applied by the first transmit amplifier 58A and the second receipt amplifier 62B.

As such, based at least in part on the output power, the return power, and a combined initial gain of the first transmit amplifier 58A and the second receipt amplifier 62B (e.g., determined using the process 124 of FIG. 13), the controller 36 may determine the combined connector loss (e.g., in decibels) of the first electrical connector 92A and the second electrical connector 92B (process block 160). For example, when determined in decibels (dBs), the controller 36 may determine the combined connector loss by subtracting the return power and the combined initial gain from the output power of the test signal. In this manner, a combined connector loss of multiple electrical connectors 92 implemented in front-end circuitry 32 of a radio frequency system 12 may be determined.

Returning to the process 142 of FIG. 14, the controller 36 may determine one or more individual connector losses (e.g., in decibels) based at least in part on the combined connector loss (process block 146). In other words, the controller 36 may divide (e.g., split) the combined connector loss of multiple electrical connectors 92 between the electrical connectors 92 to determine connector loss of individual ones of the multiple electrical connectors 92. For example, the controller 36 may determine the connector loss of a first electrical connector 92A and/or a second electrical connector 92B by dividing a combined connector loss of the first electrical connector 92A and the second electrical connector 92B between the first electrical connector 92A and the second electrical connector 92B.

As described above, in some embodiments, connector loss of each electrical connector 92 contributing to a combined connector loss may be expected (e.g., assumed) to be substantially (e.g., approximately) the same, for example, when the electrical connectors 92 are each the same length. Accordingly, in such embodiments, the controller 36 may equally divide the combined connector gain between the contributing electrical connector 92. In other words, the controller 36 may determine the connector loss of an individual electrical connectors 92 by dividing a combined connector loss by the number of electrical connectors 92 contributing to the combined connector loss. For example, the controller 36 may determine the connector loss of the first electrical connector 92A and/or the second electrical connector 92B by dividing the combined connector loss of the first electrical connector 92A and the second electrical connector 92B in half. As described above, in other embodiments, the controller 36 may more explicitly determine individual connector losses, for example, when electrical connectors 92 are not expected to have the same connector loss and/or to facilitate improving accuracy of determined connector losses, which, at least in some instances, may improve efficacy of the amplifier gain calibration (e.g., optimization) techniques.

Figure 16:
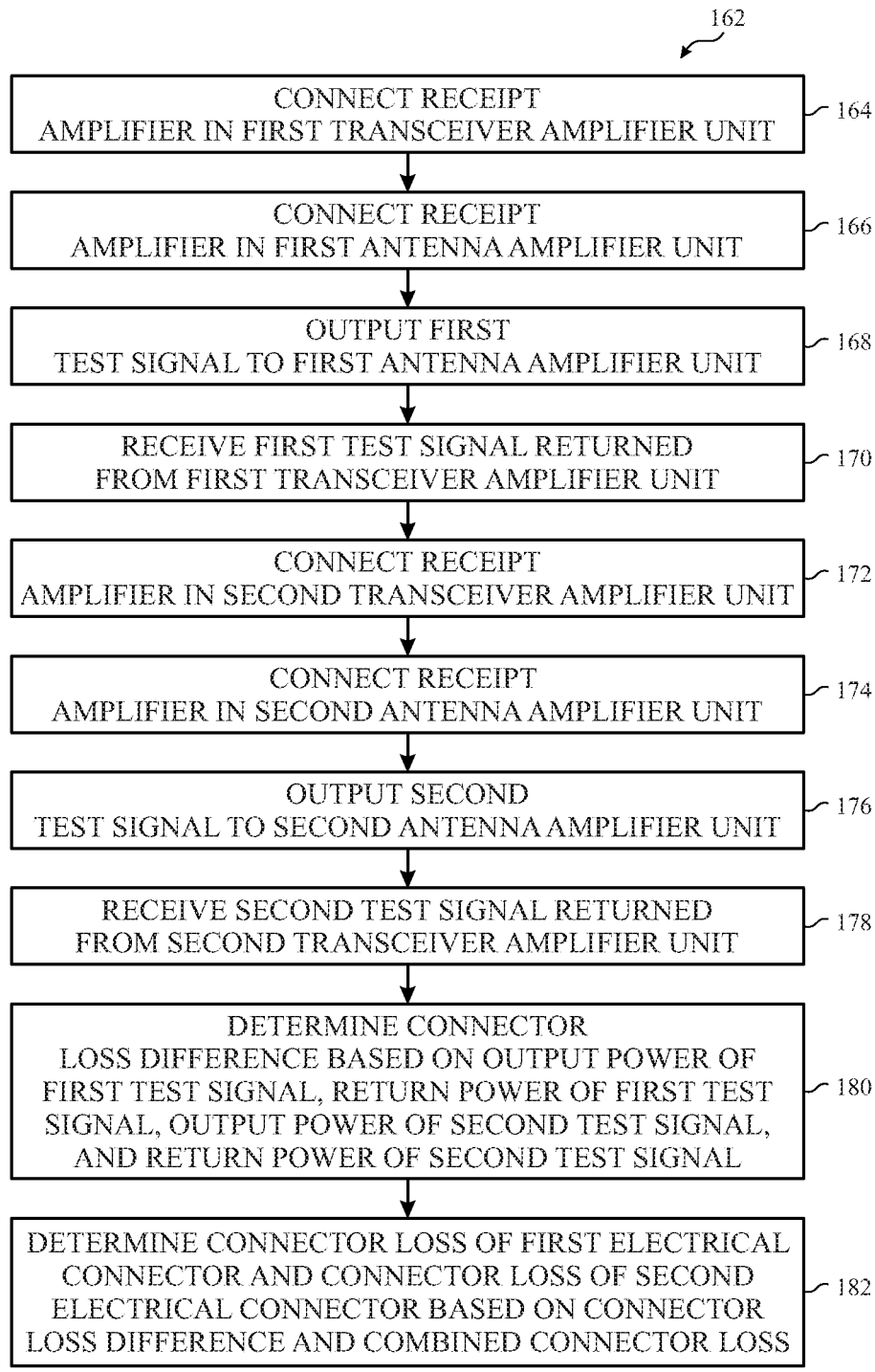
FIG. 16 is a flow diagram of an example process for determining individual connector loss based at least in part on the combined connector loss, in accordance with an embodiment of the present disclosure.

To help illustrate, an example of a process 162 for determining connector loss of an individual electrical connector 92 is described in FIG. 16. Generally, the process 162 includes connecting a receipt amplifier in a first transceiver amplifier unit (process block 164), connecting a receipt amplifier in a first antenna amplifier unit (process block 166), outputting a first test signal to the first antenna (process block 168), receiving the first test signal returned from the first transceiver amplifier unit (process block 170). Additionally, the process 162 generally includes connecting a receipt amplifier in a second transceiver amplifier unit (process block 172), connecting a receipt amplifier in a second antenna amplifier unit (process block 174), outputting a second test signal to the second antenna amplifier unit (process block 176), and receiving the second test signal returned from the second transceiver amplifier unit (process block 178). Furthermore, the process 162 generally includes determining a connector loss difference based on output power of the first test signal, return power of the first test signal, output power of the second test signal, and return power of the second test signal (process block 180). Moreover, the process 162 generally includes determining connector loss of a first electrical connector and connector loss of a second electrical connector based on the connector loss difference and a combined connector loss (process block 182).

Although described in a particular order, which represents a particular embodiment, it should be noted that the process 162 may be performed in any suitable order. Additionally, embodiments of the process 162 may omit process blocks and/or include additional process blocks. Moreover, in some embodiments, the process 162 may be implemented at least in part by executing instructions stored in a tangible, non-transitory, computer-readable medium, such as controller memory 40, using processing circuitry, such as the controller processor 38.

Accordingly, in some embodiments, a controller 36 may instruct front-end circuitry 32 implemented in a radio frequency system 12 to connect a first receipt amplifier 62A in a first transceiver amplifier unit 82A (process block 164). As described above, in some embodiments, a first receipt amplifier switching device 64A may operate to selective connect the first receipt amplifier 62A in the first transceiver amplifier unit 82A. In other words, in such embodiments, the first transceiver amplifier unit 82A may connect the first receipt amplifier 62A by closing (e.g., switching to a closed position or state) the first receipt amplifier switching device 64A, for example, while maintaining its first transmit amplifier switching device 60A amplifier open (e.g., an open position or state) and, thus, its first transmit amplifier 58A disconnected.

Additionally, the controller 36 may instruct the front-end circuitry 32 to connect a third receipt amplifier 62C in a first antenna amplifier unit 90A (process block 166). As described above, in some embodiments, a third receipt amplifier switching device 64C may operate to selectively connect the third receipt amplifier 62C in the first antenna amplifier unit 90A. In other words, in such embodiments, the first antenna amplifier unit 90A may connect the third receipt amplifier 62C by closing the third receipt amplifier switching device 64C, for example, while maintaining its third transmit amplifier switching device 60C open and, thus, its third transmit amplifier 58C disconnected.

While the front-end circuitry 32 is connected in this manner (e.g., with electrical connector switching devices 118 open), the controller 36 may instruct an analog electrical signal generator 122 to output a first test (e.g., analog electrical) signal to the first antenna amplifier unit 90A, for example, with a specific or otherwise known output power (process block 168). In some embodiments, the first test signal may be sine wave. As described above, in some embodiments, the analog electrical signal generator 122 may be a local oscillator 56, for example, implemented in a transceiver integrated circuit 74 and/or a separate device coupled to the front-end circuitry 32 during the calibration process.

To enable supply of the first test signal to the first antenna amplifier unit 90A, the analog electrical signal generator 122 may be connected to the first antenna amplifier unit 90A. As described above, in some embodiments, a first signal generator switching device 120A may operate to selectively connect the analog electrical signal generator 122 to the first antenna amplifier unit 90A. In other words, in such embodiments, the front-end circuitry 32 may connect the analog electrical signal generator 122 to the first antenna amplifier unit 90A by closing the first signal generator switching device 120A, for example, while maintaining a second signal generator switching device 120B open and, thus, the analog electrical signal generator 122 disconnected from a second antenna amplifier unit 90B.

After output to the first antenna amplifier unit 90A, the first test signal may be amplified by the third receipt amplifier 62C, amplified by the first receipt amplifier 62A after flowing through the first electrical connector 92A, and returned from the first transceiver amplifier unit 82A to the transceiver integrated circuit 74 (process block 170). In some embodiments, the controller 36 may determine return power of the first test signal based at least in part on a corresponding digital electrical signal, for example, generated by an analog-to-digital converter 42 and output to the controller 36 from the transceiver integrated circuit 74. Additionally or alternatively, the controller 36 may determine the return power by measuring voltage and/or current of the first test signal output from the first transceiver amplifier unit 82A via one or more sensors.

Furthermore, the controller 36 may instruct the front-end circuitry 32 to connect a second receipt amplifier 62B in a second transceiver amplifier unit 82B (process block 172). As described above, in some embodiments, a second receipt amplifier switching device 64B may operate to selective connect the second receipt amplifier 62B in the second transceiver amplifier unit 82B. In other words, in such embodiments, the second transceiver amplifier unit 82B may connect the first receipt amplifier 62A by closing (e.g., switching to a closed position or state) the second receipt amplifier switching device 64B, for example, while maintaining the second transmit amplifier switching device 60B amplifier open (e.g., an open position or state) and, thus, the second transmit amplifier 58B disconnected.

Furthermore, the controller 36 may instruct the front-end circuitry 32 to connect a fourth receipt amplifier 62D in the second antenna amplifier unit 90B (process block 174). As described above, in some embodiments, a fourth receipt amplifier switching device 64D may operate to selectively connect the fourth receipt amplifier 62D in the second antenna amplifier unit 90B. In other words, in such embodiments, the second antenna amplifier unit 90B may connect the fourth receipt amplifier 62D by closing the fourth receipt amplifier switching device 64D, for example, while maintaining a fourth transmit amplifier switching device 60D open and, thus, a fourth transmit amplifier 58D disconnected.

While the front-end circuitry 32 is connected in this manner (e.g., with electrical connector switching devices 118 open), the controller 36 may instruct an analog electrical signal generator 122 to output a second test (e.g., analog electrical) signal to the second antenna amplifier unit 90B, for example, with a specific or otherwise known output power (process block 176). In some embodiments, the second test signal may be sine wave. As described above, in some embodiments, the analog electrical signal generator 122 may be a local oscillator 56, for example, implemented in a transceiver integrated circuit 74 and/or a separate device coupled to the front-end circuitry 32 during the calibration process.

To enable supply of the second test signal to the second antenna amplifier unit 90B, the analog electrical signal generator 122 may be connected to the second antenna amplifier unit 90B. As described above, in some embodiments, a second signal generator switching device 120B may operate to selectively connect the analog electrical signal generator 122 to the second antenna amplifier unit 90B. In other words, in such embodiments, the front-end circuitry 32 may connect the analog electrical signal generator 122 to the second antenna amplifier unit 90B by closing the second signal generator switching device 120B, for example, while maintaining the first signal generator switching device 120A open and, thus, the analog electrical signal generator 122 disconnected from the first antenna amplifier unit 90A.

After output to the second antenna amplifier unit 90B, the second test signal may be amplified by the fourth receipt amplifier 62D, amplified by the second receipt amplifier 62B after flowing through the second electrical connector 92B, and returned from the second transceiver amplifier unit 82B to the transceiver integrated circuit 74 (process block 178). In some embodiments, the controller 36 may determine return power of the second test signal based at least in part on a corresponding digital electrical signal, for example, generated by an analog-to-digital converter 42 and output to the controller 36 from the transceiver integrated circuit 74. Additionally or alternatively, the controller 36 may determine the return power by measuring voltage and/or current of the second test signal output (e.g., returned or received) from the second transceiver amplifier unit 82B via one or more sensors.

The controller 36 may then determine a connector loss difference (e.g., in decibels) based at least in part on the output power of the first test signal, the return power of the first test signal, the output power of the second test signal, and the return power of the second test signal (process block 180). For example, since the electrical connectors 92 are disconnected from one another, power changes in the first test signal may result from connector loss of the first electrical connector 92A as well as the gain (e.g., amplification) applied by the first receipt amplifier 62A and the third receipt amplifier 62C. As such, in some embodiments, the controller 36 may determine a first gain-loss value associated with the first electrical connector 92A based at least in part on the output power and the return (e.g., received) power of the first test signal. For example, the controller 36 may determine the first gain-loss value associated with the first electrical connector 92A by subtracting the return power from the output power of the first test signal.

Similarly, power changes in the second test signal may result from connector loss of the second electrical connector 92B as well as the gain (e.g., amplification) applied by the second receipt amplifier 62B and the fourth receipt amplifier 62D. As such, in some embodiments, the controller 36 may determine a second gain-loss value associated with the second electrical connector 92B based at least in part on the output power and the return (e.g., received) power of the second test signal. For example, the controller 36 may determine the second gain-loss value associated with the second electrical connector 92B by subtracting the return power from the output power of the second test signal.

To facilitate calibration, in some embodiments, initial combined gain of the first receipt amplifier 62A and the third receipt amplifier 62C may be set and/or assumed to be equal to initial combined gain of the second receipt amplifier 62B and the fourth receipt amplifier 62D. In other words, in such embodiments, a gain offset applied to the first test signal may be or assumed to be equal to a gain offset applied to the second test signal. As such, the controller 36 may determine a connector loss difference between the first electrical connector 92A and the second electrical connector 92B by subtracting the first gain-loss value associated with the first electrical connector 92A from the second gain-loss value associated with the second electrical connector 92B.

Based at least in part on the connector loss difference and a combined connector loss (e.g., determined via the process 148 of FIG. 15), the controller 36 may determine a first connector loss (e.g., in decibels) of the first electrical connectors 92A and a second connector loss (e.g., in decibels) of the second electrical connector 92B (process block 182). As described above, the combined connector loss may be the sum of the first connector loss of the first electrical connector 92A and the second connector loss of the second electrical connector 92B. Additionally, as described above, the connector loss difference may be the difference between the first connector loss of the first electrical connector 92A and the second connector loss of the second electrical connector 92B. As such, when the connector loss difference is determined by subtracting the first gain-loss value from the second gain-loss value, the controller 36 may determine the first connector loss of the first electrical connector 92A by adding the connector loss difference to the combined connector loss and dividing by two.

In some embodiments, the controller 36 may determine the second connector loss of the second electrical connector 92B in an analogous manner. For example, when the connector loss difference is determined by subtracting the first gain-loss value from the second gain-loss value, the controller 36 may determine the second connector loss of the second electrical connector 92B by subtracting the connector loss difference from the combined connector loss and dividing by two. Additionally or alternatively, the controller 36 may determine and/or verify the second connector loss of the second electrical connector 92B by subtracting the first connector loss of the first electrical connector 92A from the combined connector loss. In this manner, individual connector losses of one or more electrical connectors 92 implemented in front-end circuitry 32 of a radio frequency system 12 may be determined.

Returning to the process 110 of FIG. 11, based at least in part on connector of one or more electrical connectors 92 implemented in the front-end circuitry 32, the controller 36 may optimize the amplifier gain, for example, by adjusting the amplifier gain from an initial amplifier gain value to an adjusted amplifier unit again value (process block 116). In some embodiments, optimizing amplifier gain may include optimizing gain to be applied by transmit amplifiers 58 implemented in amplifier units 48 (e.g., transceiver amplifier units 82 and/or antenna amplifier units 90) of the front-end circuitry 32 (process block 184). Additionally, in some embodiments, optimizing amplifier gain may include optimizing gain to be applied by receipt amplifiers 62 implemented in the amplifier units 48 of the front-end circuitry 32 (process block 186).

Furthermore, in some embodiments, the controller 36 may optimize gain to be applied by an amplifier unit 48 based at least in part on connector loss of an electrical connector 92 coupled to the amplifier unit 48. For example, the controller 36 may optimize the gain of the first transceiver amplifier unit 82A and/or the gain of first antenna amplifier unit 90A by increasing its initial gain value by the first connector loss of the first electrical connector 92A (e.g., initial gain value+first connector loss). Similarly, the controller 36 may optimize the gain of the second transceiver amplifier unit 82B and/or the gain of second antenna amplifier unit 90B by increasing its initial gain value by the second connector loss of the second electrical connector 92B (e.g., initial gain value+second connector loss).

Additionally or alternatively, the controller 36 may explicitly optimize amplifier gain via one or more objective functions that balance various factors affecting communication reliability and/or operational efficiency, such as resulting power consumption, communication distance, noise produced in other data communication, and/or analog-to-digital converter 42 resolution. For example, the transmit gain of one or more transmit amplifiers 58 implemented in the amplifier units 48 may be optimized based at least in part on a transmit objective function that factors in resulting power consumption, communication distance, and/or noise produced in other data communication, such as analog electrical signals concurrently being communicated in the radio frequency system 12. In other words, in some embodiments, the transmit gain of the one or more transmit amplifiers 58 may be optimized such that resulting output power enables transmitted electromagnetic waves to reach an access point, such as a cellular tower, while reducing power consumption resulting from operation of the transmit amplifiers 58 and/or magnitude of noise introduced in concurrently communicated analog electrical signals by the transmitted electromagnetic waves.

Additionally or alternatively, the receipt gain of one or more receipt amplifiers 62 implemented in the amplifier units 48 may be optimized based at least in part on a receipt objective function that factors in resulting power consumption and/or resolution of an analog-to-digital converter 42, for example, implemented in the transceiver integrated circuit 74. In other words, in some embodiments, the gain of the one or more receipt amplifiers 62 may be optimized such resolution of the analog-to-digital converter 42 is improved (e.g., dynamic range maximized) while reducing power consumption resulting from operation of the receipt amplifiers 62. As described above, in some embodiments, resolution of the analog-to-digital converter 42 may be improved by increasing number of expected analog values that fall within its dynamic range after amplification by the receipt amplifiers 62. In this manner, amplifier gain implemented in front-end circuitry 32 of a radio frequency system 12 may be optimized (e.g., calibrated) to facilitate balancing effects of the amplifier gain on operational efficiency and/or communication reliability of the radio frequency system 12.

Figure 17:
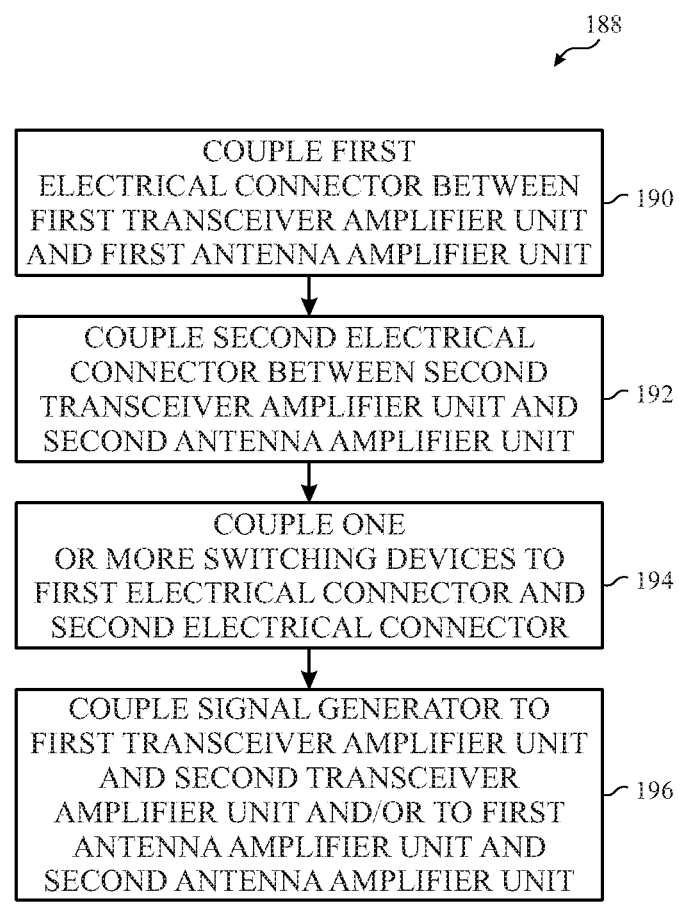
FIG. 17 is a flow diagram of an example process for implementing the front-end circuitry of FIG. 7, in accordance with an embodiment of the present disclosure.

An example of a process 188 for implementing a calibration portion of front-end circuitry 32 in a radio frequency system 12 is described in FIG. 17. Generally, the process 188 includes coupling a first electrical connector between a first transceiver amplifier unit and a first antenna amplifier unit (process block 190), coupling a second electrical connector between a second transceiver amplifier unit and a second antenna amplifier unit (process block 192), coupling one or more switching devices to the first electrical connector and the second electrical connector (process block 194), and coupling a signal generator to the first transceiver amplifier unit and the second transceiver amplifier unit and/or to the first antenna amplifier unit and the second antenna amplifier unit (process block 196).

Although described in a particular order, which represents a particular embodiment, it should be noted that the process 188 may be performed in any suitable order. Additionally, embodiments of the process 188 may omit process blocks and/or include additional process blocks. Moreover, in some embodiments, the process 188 may be implemented at least in part by a manufacturer and/or a system integrator, for example, during manufacture of front-end circuitry 32 and/or integration of the front-end circuitry 32 in a radio frequency system 12.

As described above, in some embodiments, a first electrical connector 92A may be coupled between a first transceiver amplifier unit 82A and a first antenna amplifier unit 90A, for example, to enable communication of a first data stream 80A between a transceiver integrated circuit 74 and an antenna integrated circuit 78 (process block 190). In other words, a first end (e.g., transceiver-side) of the first electrical connector 92A may be coupled to the first transceiver amplifier unit 82A and a second end (e.g., antenna-side) of the first electrical connector 92A may be coupled to the first antenna amplifier unit 90A. In some embodiments, the first electrical connector 92A may include a wire, a cable, a conductive trace, or any combination thereof.

Additionally, as described above, in some embodiments, a second electrical connector 92B may be coupled between a second transceiver amplifier unit 82B and a second antenna amplifier unit 90B, for example, to enable communication of a second data stream 80 between the transceiver integrated circuit 74 and the antenna module 78 (process block 192). In other words, a first end (e.g., transceiver-side) of the second electrical connector 92B may be coupled to the second transceiver amplifier unit 82B and a second end (e.g., antenna-side) of the second electrical connector 92B may be coupled to the second antenna amplifier unit 90B. In some embodiments, the second electrical connector 92B may include a wire, a cable, a conductive trace, or any combination thereof.

To facilitate determining initial amplifier gain and/or connector loss, as described above, one or more routing switching devices 66 may be coupled to the first electrical connector 92A and/or the second electrical connector 92B (process block 194). For example, a first electrical connector switching device 118A may be coupled between an antenna-side of the first electrical connector 92A and an antenna-side of the second electrical connector 92B. Additionally, in some embodiments, a second electrical connector switching device 118B may be coupled between a transceiver-side of the first electrical connector 92A and a transceiver-side of the second electrical connector 92B. However, as described above, in other embodiments, the second electrical connector switching device 118B may be obviated, for example, when initial amplifier gain values are pre-determined or otherwise known, which, at least in some instances, may facilitate reducing implemented associated cost (e.g., component count, manufacturing steps, and/or physical footprint) of the front-end circuitry 32.

Additionally, as described above, in some embodiments, one or more signal generator switching devices 120 may be coupled to the antenna amplifier units 90. For example, a first signal generator switching device 120A may be coupled to an antenna-side (e.g., opposite the first electrical connector 92A) of the first antenna amplifier unit 90A. Additionally, a second signal generator switching device 120B may be coupled to an antenna-side (e.g., opposite the second electrical connector 92B) of the second antenna amplifier unit 90B.

Furthermore, as described above, one or more analog electrical signal generators 122 may be coupled to the first transceiver amplifier unit 82A and the second transceiver amplifier unit 82B and/or to the first antenna amplifier unit 90A and the second antenna amplifier unit 90B (process block 196). As described above, in some embodiments, an analog electrical signal generator 122 may be a local oscillator 56 implemented in the transceiver integrated circuit 74 and, thus, may be coupled to the first transceiver amplifier unit 82A and the second transceiver amplifier unit 82B by coupling the transceiver integrated circuit 74 to a transceiver-side (e.g., opposite electrical connectors 92) of the transceiver amplifier units 82. In such embodiments, an analog electrical signal generator 122 additionally may be coupled to the first antenna amplifier unit 90A and the second antenna amplifier unit 90B by coupling the transceiver integrated circuit 74 to an antenna-side of the antenna amplifier units 90 via the signal generator switching devices 120.

As described above, a separate analog electrical generator 122 may additionally or alternatively be coupled to the antenna-side of the antenna amplifier units 90 via the signal generator switching devices 120. In other words, in some embodiments, the analog electrical signal generator 122 and/or the signal generator switching devices 120 coupled to the antenna-side of the antenna amplifier units 90 may be implemented in a separate calibration device. To facilitate reducing implementation associated cost (e.g., physical footprint), in some embodiments, the separate calibration device may be coupled to the front-end circuitry 32 during the calibration process and removed before deployment. However, as described above, in other embodiments, an analog electrical signal generator 122 and, thus, corresponding signal generator switching device 120 may be obviated, for example, when multiple electrical connectors 92 contribute or are expected (e.g., assumed) to contribute the same amount to a combined connector loss, which, at least in some instances, may facilitate reducing implemented associated cost (e.g., component count, manufacturing steps, and/or physical footprint) of the front-end circuitry 32.

Figure 18:
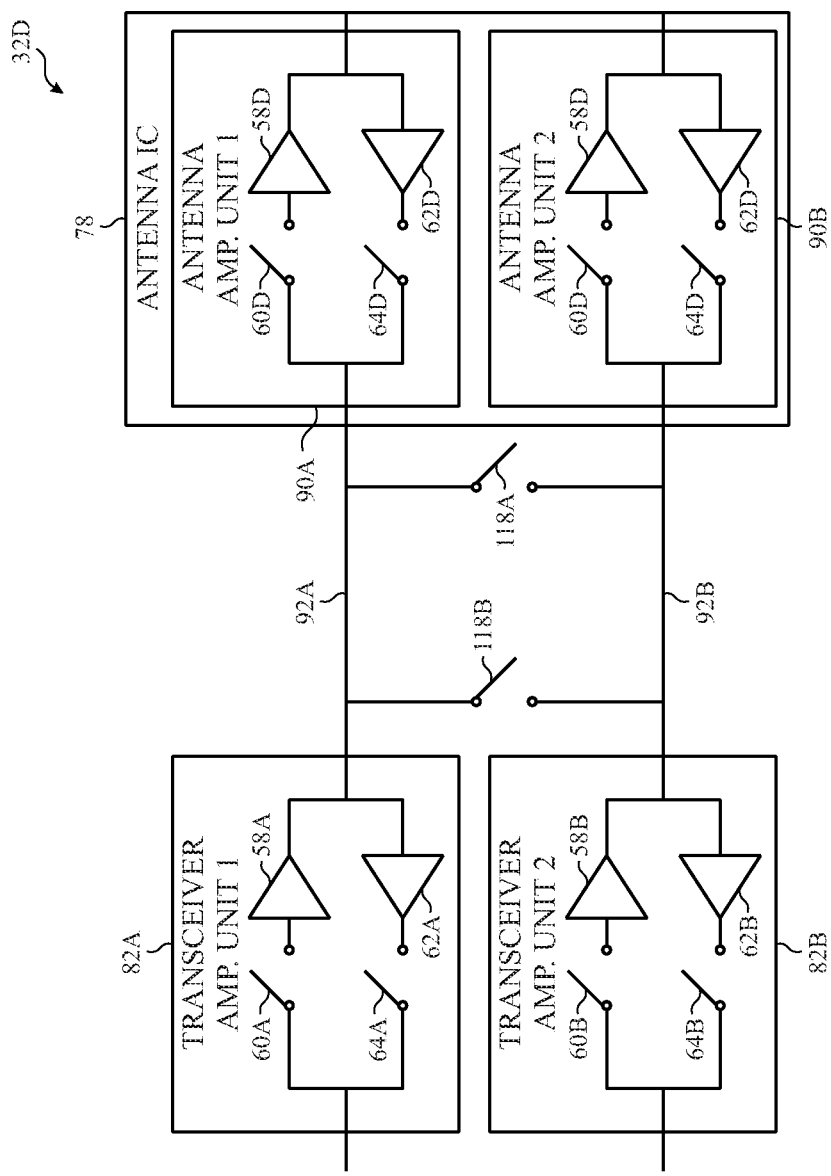
FIG. 18 is another example of a portion of the front-end circuitry of FIG. 8 implemented to facilitate calibrating amplifier gain, in accordance with an embodiment of the present disclosure.

To help illustrate, another example of a calibration portion of front-end circuitry 32D implemented to enable concurrently (e.g., simultaneously) communicating two data streams 80 via an antenna integrated circuit 78 is shown in FIG. 18. As depicted, the front-end circuitry 32D generally includes the same components (e.g., circuitry) as the front-end circuitry 32C described with reference to FIG. 12, but without the analog electrical signal generator 122 and the generator switching devices 120. As such, the front-end circuitry 32D described with reference to FIG. 18 may generally be operated in an analogous manner to enable a controller 36 to determine initial amplifier gain and/or combined connector gain.

However, the controller 36 may determine individual connector losses in a different (e.g., less explicit) manner. For example, instead of explicitly determining individual connector loss (e.g., using the process 162 of FIG. 16), the controller 36 may determine connector loss of individual electrical connectors 92 contributing to a combined connector loss by equally dividing the combined connector loss between the electrical connectors 92. In addition to facilitating a reduction in implementation associated cost, in some embodiments, determining individual connector loss in this manner may facilitate reducing duration, steps, and/or computational complexity of the calibration process, which, at least in some instances, may facilitate improving efficiency of the calibration process and/or uptime of a radio frequency system 12 calibrated online (e.g., after deployment). To facilitate further reducing implementation associated cost, as described above, in some embodiments, one or more electrical connector switching devices 118 may be obviated, for example, when initial amplifier gain values are pre-determined or otherwise known.

Figure 19:
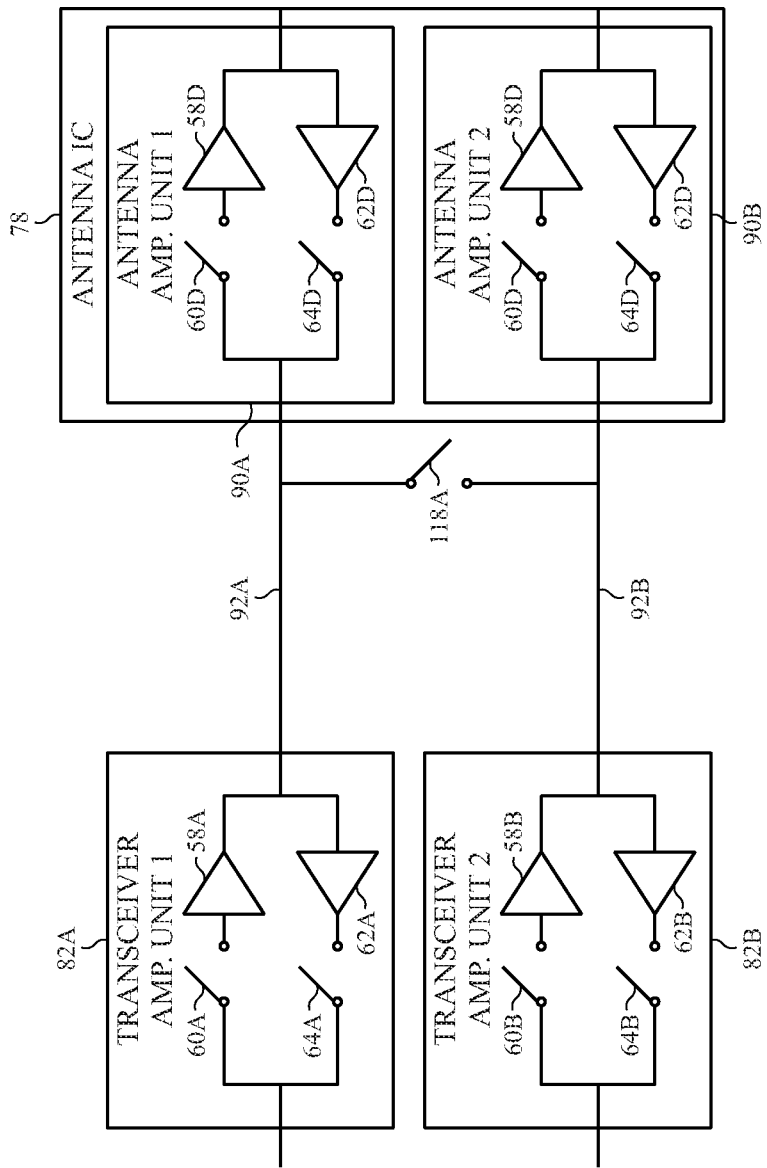
FIG. 19 is another example of a portion of the front-end circuitry of FIG. 8 implemented to facilitate calibrating amplifier gain, in accordance with an embodiment of the present disclosure.

To help illustrate, another example of a calibration portion of front-end circuitry 32E implemented to enable concurrently (e.g., simultaneously) communicating two data streams 80 via an antenna integrated circuit 78 is shown in FIG. 18. As depicted, the front-end circuitry 32E generally includes the same components (e.g., circuitry) as the front-end circuitry 32D described with reference to FIG. 18, but without the second electrical connector switching device 118B. As such, the front-end circuitry 32E described with reference to FIG. 19 may generally be operated in an analogous manner to enable a controller 36 to determine combined connector loss and/or individual connector losses.

However, the controller 36 may determine initial amplifier gain in a different (e.g., less explicit) manner. For example, as described above, pre-determined or otherwise known initial amplifier gain values may be stored in a tangible, non-transitory, computer-readable medium, such as the controller memory 40. As such, instead of explicitly determining initial amplifier gain (e.g., using the process 124 of FIG. 13), the controller 36 may retrieve the initial amplifier gain values from the tangible, non-transitory, computer-readable medium. In addition to facilitating a reduction in implementation associated cost, in some embodiments, determining initial amplifier gain in this manner may facilitate reducing duration, steps, and/or computational complexity of the calibration process, which, at least in some instances, may facilitate improving efficiency of the calibration process and/or uptime of a radio frequency system 12 calibrated online (e.g., after deployment).

Accordingly, the technical effects of the techniques described in the present disclosure include improving operational efficiency and/or communication reliability of a radio frequency system and, thus, an electronic device in which the radio frequency system is implemented. For example, implementing and/or operating front-end circuitry in accordance with the calibration process described above may enable determination of connector loss of one or more electrical connectors coupled to an amplifier unit implemented in the front-end circuitry. Additionally, implementing and/or operating front-end circuitry in accordance with the calibration process described above may enable gain (e.g., transmit gain and/or receipt gain) to be applied by the amplifier unit during wireless to be adjusted based at least in part on the connector loss. For example, adjusting transmit gain to be applied by one or more amplifiers unit during wireless transmission based at least in part on the connector loss may facilitate optimizing tradeoffs between power consumption resulting from the transmit gain, transmission distance resulting from the transmit gain, filtering effectiveness resulting from the transmit gain, and/or noise resulting from concurrent transmission of electromagnetic waves.

Additionally or alternatively, adjusting receipt gain to be applied by one or more amplifier units during wireless communication may facilitate optimizing tradeoffs between power consumption resulting from the receipt gain and effects on resolution of an analog-to-digital converter resulting from the receipt gain.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

What is claimed is:

1. An electronic device comprising a radio frequency system, wherein the radio frequency system comprises:
   a first antenna integrated circuit comprising a first antenna amplifier unit configured to amplify a first data stream while the first data stream is being wirelessly communicated via the first antenna integrated circuit and a second antenna amplifier unit configured to amplify a second data stream while the second data stream is being wirelessly communicated via the first antenna integrated circuit;
   a first transceiver amplifier unit coupled to the first antenna amplifier unit via a first electrical connector, wherein the first transceiver amplifier unit is configured to amplify the first data stream while the first data stream is being wirelessly communicated via the first antenna integrated circuit;
   a second transceiver amplifier unit coupled to the second antenna amplifier unit via a second electrical connector, wherein the second transceiver amplifier unit is configured to amplify the second data stream while the second data stream is being wirelessly communicated via the first antenna integrated circuit; and
   a first electrical connector switching device coupled between a first antenna-side of the first electrical connector and a second antenna-side of the second electrical connector, wherein the first electrical connector switching device is configured to electrically connect the first antenna-side of the first electrical connector and the second antenna-side of the second electrical connector during a gain calibration process.

2. The electronic device of claim 1, comprising a controller, wherein:
   the first transceiver amplifier unit comprises a transmit amplifier and a transmit amplifier switching device coupled in series with the transmit amplifier;
   the second transceiver amplifier unit comprises a receipt amplifier and a receipt amplifier switching device coupled in series with a receipt amplifier; and
   the controller is configured to, during the gain calibration process:
      instruct the first transceiver amplifier unit to close the transmit amplifier switching device to connect the transmit amplifier in the first transceiver amplifier unit;
      instruct the second transceiver amplifier unit to close the receipt amplifier switching device to connect the receipt amplifier in the second transceiver amplifier unit;
      instruct the radio frequency system to close the first electrical connector switching device to connect first antenna-side of the first electrical connector and the second antenna-side of the second electrical connector;

instruct the radio frequency system to supply a test signal to the first transceiver amplifier unit; and determine a combined connector loss of the first electrical connector and the second electrical connector based at least in part on output power of the test signal supplied to the first transceiver amplifier unit, return power of the test signal output from the second transceiver amplifier unit, and an initial combined gain of the transmit amplifier and the receipt amplifier.

3. The electronic device of claim 1, wherein the radio frequency system comprises a second electrical connector switching device coupled between a first transceiver-side of the first electrical connector and a second transceiver-side of the second electrical connector, wherein the second electrical connector switching device is configured to electrically connect the first transceiver-side of the first electrical connector and the second transceiver-side of the second electrical connector during the gain calibration process.

4. The electronic device of claim 3, comprising a controller, wherein:

the first transceiver amplifier unit comprises the transmit amplifier and a transmit amplifier switching device coupled in series with the transmit amplifier;

the second transceiver amplifier unit comprises the receipt amplifier and a receipt amplifier switching device coupled in series with the receipt amplifier; and the controller is configured to, during the gain calibration process:

instruct the first transceiver amplifier unit to close the transmit amplifier switching device to connect the transmit amplifier in the first transceiver amplifier unit;

instruct the second transceiver amplifier unit to close the receipt amplifier switching device to connect the receipt amplifier in the second transceiver amplifier unit;

instruct the radio frequency system to close the second electrical connector switching device to connect first transceiver-side of the first electrical connector and the second transceiver-side of the second electrical connector;

instruct the radio frequency system to supply a test signal to the first transceiver amplifier unit;

determine the initial combined gain of the transmit amplifier and the receipt amplifier based at least in part on output power of the test signal supplied to the first transceiver amplifier unit and return power of the test signal output from the second transceiver amplifier unit; and determine a combined connector loss of the first electrical connector and the second electrical connector based at least in part on the initial combined gain of the transmit amplifier and the receipt amplifier.

5. The electronic device of claim 1, wherein the radio frequency system comprises:

an analog electrical signal generator configured to generate a test signal;

a first signal generator switching device coupled between the analog electrical signal generator and the first antenna amplifier unit, wherein the first signal generator switching device is configured to supply the test signal to the first antenna amplifier unit during the gain calibration process; and a second signal generator switching device coupled between the analog electrical signal generator and the second antenna amplifier unit, wherein the second signal generator switching device is configured to supply the test signal to the second antenna amplifier during the gain calibration process.

6. The electronic device of claim 5, comprising a controller, wherein:

the first transceiver amplifier unit comprises a first receipt amplifier and a first receipt amplifier switching device coupled in series with the first receipt amplifier;

the first antenna amplifier unit comprises a second receipt amplifier and a second receipt amplifier switching device coupled in series with the second receipt amplifier; and the controller is configured to, during the gain calibration process:

instruct the first transceiver amplifier unit to close the first receipt amplifier switching device to connect the first receipt amplifier in the first transceiver amplifier unit;

instruct the first antenna amplifier unit to close the second receipt amplifier switching device to connect the second receipt amplifier in the first antenna amplifier unit;

instruct the radio frequency system to close the first signal generator switching device to enable the analog electrical signal generator to supply a first instance of the test signal to the first antenna amplifier unit;

determine a first gain-loss value associated with the first electrical connector based at least in part on output power of the first instance of the test signal supplied to the first antenna amplifier unit and return power of the first instance of the test signal output from the first transceiver amplifier unit; and determine the first connector loss of the first electrical connector based at least in part on the first gain-loss value and a combined connector loss of the first electrical connector and the second electrical connector.

7. The electronic device of claim 6, wherein:

the second transceiver amplifier unit comprises a third receipt amplifier and a third receipt amplifier switching device coupled in series with the third receipt amplifier;

the second antenna amplifier unit comprises a fourth receipt amplifier and a fourth receipt amplifier switching device coupled in series with the fourth receipt amplifier; and the controller is configured to, during the gain calibration process:

instruct the second transceiver amplifier unit to close the third receipt amplifier switching device to connect the third receipt amplifier in the second transceiver amplifier unit;

instruct the second antenna amplifier unit to close the fourth receipt amplifier switching device to connect the fourth receipt amplifier in the second antenna amplifier unit;

instruct the radio frequency system to close the second signal generator switching device to enable the analog electrical signal generator to supply a second instance of the test signal to the second antenna amplifier unit;

determine a second gain-loss value associated with the second electrical connector based at least in part on output power of the second instance of the test signal supplied to the second antenna amplifier unit and return power of the second instance of the test signal output from the second transceiver amplifier unit; and determine the first connector loss of the first electrical connector, the second connector loss of the second electrical connector, or both based at least in part on the first gain-loss value associated with the first electrical connector, the second gain-loss value associated with the second electrical connector, and the combined connector loss of the first electrical connector and the second electrical connector.

8. The electronic device of claim 1, wherein the radio frequency system comprises:
a second antenna integrated circuit comprising a third antenna amplifier unit configured to amplify the first data stream while the first data stream is being wirelessly communicated via the second antenna integrated circuit and a fourth antenna amplifier unit configured to amplify the second data stream while the second data stream is being wirelessly communicated via the second antenna integrated circuit;
a third transceiver amplifier unit coupled to the third antenna amplifier unit via a third electrical connector, wherein the third transceiver amplifier unit is configured to amplify the first data stream while the first data stream is being wirelessly communicated via the second antenna integrated circuit;
a fourth transceiver amplifier unit coupled to the fourth antenna amplifier unit via a fourth electrical connector, wherein the fourth transceiver amplifier unit is configured to amplify the second data stream while the second data stream is being wirelessly communicated via the second antenna integrated circuit; and
a second electrical connector switching device coupled between a third antenna-side of the third electrical connector and a fourth antenna-side of the fourth electrical connector, wherein the second electrical connector switching device is configured to electrically connect the third antenna-side of the third electrical connector and the fourth antenna-side of the fourth electrical connector during the gain calibration process.

9. The electronic device of claim 1, wherein:
the first antenna integrated circuit is configured to wirelessly communicate the first data stream and the second data stream concurrently; and
the first antenna integrated circuit comprises an antenna configured to wirelessly communicate the first data stream via horizontally polarized electromagnetic waves and wirelessly communicate the second data stream via vertically polarized electromagnetic waves.

10. The electronic device of claim 1, comprising a controller configured to, during the gain calibration process:
determine a connector loss of the first electrical connector based at least in part on a combined connector loss of the first electrical connector and the second electrical connector;
optimize a first gain to be applied by the first transceiver amplifier unit during wireless communication of the first data stream via the first antenna integrated circuit based at least in part on the first connector loss of the first electrical connector and a first power consumption of the first transceiver amplifier unit to apply the first gain; and
optimize a second gain to be applied by the first antenna amplifier unit during wireless communication of the first data stream via the first antenna integrated circuit based at least in part on the first connector loss of the first electrical connector and a second power consumption of the first antenna amplifier unit to apply the second gain.

11. The electronic device of claim 10, wherein the controller is configured to, during the gain calibration process:
determine a second connector loss of the second electrical connector based at least in part on the combined connector loss of the first electrical connector and the second electrical connector;
optimize a third gain to be applied by the second transceiver amplifier unit during wireless communication of the second data stream via the first antenna integrated circuit based at least in part on the second connector loss of the second electrical connector and a third power consumption of the second transceiver amplifier unit to apply the third gain; and
optimize a fourth gain to be applied by the second antenna amplifier unit during wireless communication of the second data stream via the first antenna integrated circuit based at least in part on the second connector loss of the second electrical connector and a fourth power consumption of the second antenna amplifier unit to apply the second gain.

12. A method for implementing front-end circuitry in a radio frequency system, comprising:
coupling a first electrical connector between a transceiver integrated circuit and a first antenna integrated circuit to enable a first transceiver amplifier unit and a first antenna amplifier unit to communicate a first data stream via the first electrical connector during wireless communication of the first data stream via the first antenna integrated circuit;
coupling a second electrical connector between the transceiver integrated circuit and the first antenna integrated circuit to enable a second transceiver amplifier unit and a second antenna amplifier unit to communicate a second data stream via the second electrical connector during wireless communication of the second data stream via the first antenna integrated circuit; and
coupling a first electrical connector switching device between a first antenna-side of the first electrical connector and a second antenna-side of the second electrical connector to enable the radio frequency system to selectively connect the first antenna-side of the first electrical connector and the second antenna-side of the second electrical connector to facilitate determining a first combined connector loss of the first electrical connector and the second electrical connector.

13. The method of claim 12, comprising coupling a second electrical connector switching device between a first transceiver-side of the first electrical connector and a second transceiver-side of the second electrical connector to enable the radio frequency system to selectively connect the first transceiver-side of the first electrical connector and the second transceiver-side of the second electrical connector to facilitate determining an initial combined gain of a transmit amplifier implemented in the first transceiver amplifier unit and a receipt amplifier implemented in the second transceiver amplifier unit.

14. The method of claim 12, comprising:
coupling a first signal generator switching device between the first antenna amplifier unit and an analog electrical signal generator to enable the radio frequency system to selectively supply a first test signal to the first antenna amplifier unit to facilitate determining a difference between a first connector loss of the first electrical connector and a second connector loss of the second electrical connector; and coupling a second signal generator switching device between the second antenna amplifier unit and the analog electrical signal generator to enable the radio frequency system to selectively supply a second test signal to the second antenna amplifier unit to facilitate determining the difference between the first connector loss of the first electrical connector and the second connector loss of the second electrical connector.

15. The method of claim 12, comprising:

coupling a third electrical connector between the transceiver integrated circuit and a second antenna integrated circuit to enable a third transceiver amplifier unit and a third antenna amplifier unit to communicate the first data stream via the third electrical connector during wireless communication of the first data stream via the second antenna integrated circuit;

coupling a fourth electrical connector between the transceiver integrated circuit and the second antenna integrated circuit to enable a fourth transceiver amplifier unit and a fourth antenna amplifier unit to communicate the second data stream via the fourth electrical connector during wireless communication of the second data stream via the second antenna integrated circuit; and coupling a second electrical connector switching device between a third antenna-side of the third electrical connector and a fourth antenna-side of the fourth electrical connector to enable the radio frequency system to selectively connect the third antenna-side of the third electrical connector and the fourth antenna-side of the fourth electrical connector to facilitate determining a second combined connector loss of the third electrical connector and the fourth electrical connector.

16. A tangible, non-transitory, computer-readable medium storing instructions executable by one or more processors of an electronic device, wherein the instructions comprise instructions to:

instruct, using the one or more processors, a radio frequency system implemented in the electronic device to electrically connect a first antenna-side of a first electrical connector coupled between a transceiver integrated circuit and an antenna with a second antenna-side of a second electrical connector coupled between the transceiver integrated circuit and the antenna;

instruct, using the one or more processors, the radio frequency system to supply a first test signal to a first transceiver amplifier unit coupled to a first transceiver-side of the first electrical connector while the first antenna-side of the first electrical connector and the second antenna-side of the second electrical connector are electrically connected;

determine, using the one or more processors, a first connector loss of the first electrical connector, a second connector loss of the second electrical connector, or both based at least in part on a transmit gain applied on the first test signal by the first transceiver amplifier unit, a receipt gain applied on the first test signal by a second transceiver amplifier unit coupled to a second transceiver-side of the second electrical connector, a first output power of the first test signal supplied to the first transceiver amplifier unit, and a first return power of the first test signal output from the second transceiver amplifier unit; and adjust the transmit gain to be applied by the first transceiver amplifier unit during wireless transmission of a first data stream via the antenna based at least in part on the first connector loss of the first electrical connector, the receipt gain to be applied by the second transceiver amplifier unit during wireless reception of a second data stream via the antenna based at least in part on the second connector loss of the second electrical connector, or both.

17. The tangible, non-transitory, computer-readable medium of claim 16, wherein the instructions comprise instructions to:

instruct, using the one or more processors, the radio frequency system to electrically connect the first transceiver-side of the first electrical connector with the second transceiver-side of the second electrical connector;

instruct, using the one or more processors, the radio frequency system to supply a second test signal to the first transceiver amplifier unit while the first transceiver-side of the first electrical connector and the second transceiver-side of the second electrical connector are electrically connected;

determine, using the one or more processors, an initial combined gain of the transmit gain of the first transceiver amplifier unit and the receipt gain of the second transceiver amplifier unit based at least in part on a second output power of the second test signal supplied to first transceiver amplifier unit and a second return power of the second test signal output from the second transceiver amplifier unit; and determine, using the one or more processors, the first connector loss of the first electrical connector, the second connector loss of the second electrical connector, or both based at least in part on the initial combined gain of the transmit gain and the receipt gain.

18. The tangible, non-transitory, computer-readable medium of claim 17, comprising instructions to:

instruct, using the one or more processors, the radio frequency system to supply a third test signal to a first antenna amplifier unit coupled to the first antenna-side of the first electrical connector while the first antenna-side of the first electrical connector is electrically disconnected from the second antenna-side of the second electrical connector and the first transceiver-side of the first electrical connector is electrically disconnected from the second transceiver-side of the second electrical connector;

instruct, using the one or more processors, the radio frequency system to supply a fourth test signal to a second antenna amplifier unit coupled to the second antenna-side of the second electrical connector while the second antenna-side of the second electrical connector is electrically disconnected from the first antenna-side of the first electrical connector and the second transceiver-side of the second electrical connector is electrically disconnected from the first transceiver-side of the first electrical connector; and determine, using the one or more processors, a connector loss difference between the first electrical connector and the second electrical connector based at least in part on a third output power of the third test signal supplied to the first antenna amplifier unit, a third return power of the third test signal output from the first transceiver amplifier unit, a fourth output power of the fourth test signal supplied to the second antenna amplifier unit, and a fourth return power of the fourth test signal output from the second transceiver amplifier unit.

19. The tangible, non-transitory, computer-readable medium of claim 18, comprising instructions to:
- determine, using the one or more processors, the connector loss difference between the first electrical connector and the second electrical connector by subtracting the third return power of the third test signal output from the first transceiver amplifier unit and a sum of the fourth output power of the fourth test signal supplied to the second antenna amplifier unit and the fourth return power of the fourth test signal output from the second transceiver amplifier unit from the third output power of the third test signal supplied to the first antenna amplifier unit;
- determine, using the one or more processors, the initial combined gain of the transmit gain and the receipt gain by subtracting the second return power of the second test signal output from the second transceiver amplifier unit from the second output power of the second test signal supplied to first transceiver amplifier unit;
- determine, using the one or more processors, a combined connector loss of the first electrical connector and the second electrical connector by subtracting the initial combined gain and the first return power of the first test signal output from the second transceiver amplifier unit from the first output power of the first test signal supplied to the first transceiver amplifier unit; and
- determine, using the one or more processors, the first connector loss of the first electrical connector by adding the connector loss difference to the combined connector loss and dividing by two.

20. The tangible, non-transitory, computer-readable medium of claim 16, comprising instructions to:
- determine, using the one or more processors, a first adjusted value of the transmit gain by adjusting a first initial value of the transmit gain applied by the first transceiver amplifier unit on the first test signal based at least in part on the first connector loss of the first electrical connector and a first power consumption resulting from operation of the first transceiver amplifier unit to apply the first transmit gain with the first adjusted value;
- determine, using the one or more processors, a second adjusted value of the receipt gain by adjusting a second initial value of the receipt gain applied by the second transceiver amplifier unit on the first test signal based at least in part on the second connector loss of the second electrical connector and a second power consumption resulting from operation of the second transceiver amplifier unit to apply the receipt gain with the second adjusted value;
- instruct, using the one or more processors, the first transceiver amplifier unit to apply the transmit gain with the first adjusted value during wireless transmission of the first data stream via the antenna; and
- instruct, using the one or more processors, the second transceiver amplifier unit to apply the receipt gain with the second adjusted value during wireless reception of the second data stream via the antenna.

* * * * *